US010629787B2

(12) United States Patent
Ho et al.

(10) Patent No.: US 10,629,787 B2
(45) Date of Patent: Apr. 21, 2020

(54) LID AND AN OPTICAL DEVICE PACKAGE HAVING THE SAME

(71) Applicant: Advanced Semiconductor Engineering, Inc., Kaohsiung (TW)

(72) Inventors: Hsin-Ying Ho, Kaohsiung (TW); Hsun-Wei Chan, Kaohsiung (TW); Ying-Chung Chen, Kaohsiung (TW); Lu-Ming Lai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 8 days.

(21) Appl. No.: 15/466,502

(22) Filed: Mar. 22, 2017

(65) Prior Publication Data

US 2017/0294560 A1    Oct. 12, 2017

Related U.S. Application Data

(60) Provisional application No. 62/319,960, filed on Apr. 8, 2016.

(51) Int. Cl.
*H01L 33/58* (2010.01)
*H01L 33/60* (2010.01)
(Continued)

(52) U.S. Cl.
CPC .......... *H01L 33/58* (2013.01); *H01L 25/0753* (2013.01); *H01L 31/0203* (2013.01); *H01L 31/02005* (2013.01); *H01L 31/02327* (2013.01); *H01L 31/186* (2013.01); *H01L 33/483* (2013.01); *H01L 33/56* (2013.01); *H01L 33/60* (2013.01); *H01L 33/62* (2013.01); *H01L 25/167* (2013.01); *H01L 33/0095* (2013.01); *H01L 33/486* (2013.01); *H01L 2224/48091* (2013.01);
(Continued)

(58) Field of Classification Search
CPC ..... H01L 33/483; H01L 33/486; H01L 33/58; H01L 33/60
USPC ....................................... 257/98, 99
See application file for complete search history.

(56) References Cited

U.S. PATENT DOCUMENTS 6,930,332 B2    8/2005    Hashimoto et al.
7,717,599 B2    5/2010    Grace et al.
(Continued)

FOREIGN PATENT DOCUMENTS

CN    1466782 A      1/2004
CN    101325193 A    12/2008
(Continued)

OTHER PUBLICATIONS

Non-Final Office Action for U.S. Appl. No. 15/403,057, dated Dec. 14, 2017, 11 pages.
(Continued)

*Primary Examiner* — Matthew E Warren
(74) *Attorney, Agent, or Firm* — Foley & Lardner LLP

(57) ABSTRACT

At least some embodiments of the present disclosure relate to a lid for covering an optical device. The lid includes a metal member and a transparent encapsulant. The metal member includes a top surface, a first bottom surface, and a second bottom surface between the top surface and the first bottom surface. The transparent encapsulant is surrounded by the metal member and covers at least a portion of the second bottom surface.

5 Claims, 23 Drawing Sheets

(51) Int. Cl.
*H01L 33/48* (2010.01)
*H01L 25/075* (2006.01)
*H01L 33/56* (2010.01)
*H01L 31/02* (2006.01)
*H01L 31/0203* (2014.01)
*H01L 31/0232* (2014.01)
*H01L 31/18* (2006.01)
*H01L 33/62* (2010.01)
*H01L 25/16* (2006.01)
*H01L 33/00* (2010.01)

(52) U.S. Cl.
CPC ............... *H01L 2224/48465* (2013.01); *H01L 2933/0033* (2013.01); *H01L 2933/0058* (2013.01); *H01L 2933/0066* (2013.01)

(56) References Cited

U.S. PATENT DOCUMENTS

| | | | |
|---|---|---|---|
| 7,855,390 B2 | 12/2010 | Tsang et al. | |
| 8,183,581 B2 | 5/2012 | Gerhard | |
| 2007/0183156 A1* | 8/2007 | Shan | B60Q 1/2611 362/277 |
| 2007/0292127 A1* | 12/2007 | Kuhmann | G03B 17/28 396/529 |
| 2009/0090926 A1 | 4/2009 | Wang et al. | |
| 2010/0110659 A1 | 5/2010 | Nakajima | |
| 2011/0062471 A1 | 3/2011 | Bierhuizen et al. | |
| 2014/0084322 A1* | 3/2014 | Park | H01L 33/486 257/98 |
| 2015/0036046 A1* | 2/2015 | Rudmann | H04N 5/2252 348/374 |
| 2017/0052277 A1 | 2/2017 | Wong et al. | |

FOREIGN PATENT DOCUMENTS

| | | |
|---|---|---|
| CN | 101496170 A | 7/2009 |
| CN | 102027596 A | 4/2011 |

OTHER PUBLICATIONS

Notice of Allowance for U.S. Appl. No. 15/403,057, dated Jun. 20, 2018, 7 pages.
Office Action for corresponding Taiwan Patent Application No. 106109598, dated Oct. 12, 2018, 3 pages.
Search Report for corresponding Taiwan Patent Application No. 106109598, dated Oct. 12, 2018, 3 pages.
Office Action for corresponding Chinese Patent Application No. 201710207742.5, dated Dec. 21, 2018, 6 pages.
Search Report for corresponding Chinese Patent Application No. 201710207742.5, dated Dec. 21, 2018, 5 pages.
Office Action for corresponding Chinese Patent Application No. 201710207742.5, dated Jul. 9, 2019, 7 pages.
Search Report for corresponding Chinese Patent Application No. 201710207742.5, dated Jul. 9, 2019, 5 pages.
Office Action for corresponding Chinese Patent Application No. 201710207742.5, dated Nov. 18, 2019, 5 pages.
English translation of portions of Office Action for corresponding Chinese Patent Application No. 201710207742.5, dated Nov. 18, 2019, 3 pages.

* cited by examiner

LID AND AN OPTICAL DEVICE PACKAGE HAVING THE SAME

CROSS-REFERENCE TO RELATED APPLICATIONS

This application claims the benefit of and priority to U.S. Provisional Patent Application No. 62/319,960, filed on 8 Apr. 2016, the entire contents of which are incorporated herein by reference.

BACKGROUND

1. Technical Field

The present disclosure relates to a lid and an optical device package having the same. More particularly, the present disclosure relates to a lid for assembling an optical device package.

2. Description of the Related Art

Lids having aperture(s) are used to protect devices in semiconductor device packages. Currently, a conventional metal lid is formed by a relatively complicated process that involves techniques such as punching, bending, etc. A number of metal lids would be rearranged, and then each of the rearranged metal lids is picked and placed on a semiconductor device package. Such a process of assembling the semiconductor devices is time-consuming and costly. Alternatively, a group of plastic lids (e.g. Liquid Crystal Polymer (LCP) lids) may be placed on semiconductor device packages to save manufacturing cost and time. However, scale-down of thickness of such a plastic lid is limited to about 0.3 mm (millimeter), which is adverse to a miniaturization effort for the semiconductor device packages. Moreover, when a thickness of the plastic lid for an optical semiconductor device package is less than, e.g., 0.3 mm, optical leakage may occur in the optical semiconductor device package.

SUMMARY

In some embodiments, according to an aspect, a lid for covering an optical device includes a metal member and a transparent encapsulant. The metal member includes a top surface, a first bottom surface, and a second bottom surface between the top surface and the first bottom surface. The transparent encapsulant is surrounded by the metal member and covers at least a portion of the second bottom surface.

In some embodiments, according to another aspect, a lid for covering an optical device includes a first transparent encapsulant and a metal member. The metal member includes a wall surrounding the first transparent encapsulant and a roof portion extended from the wall and on at least a portion of the first transparent encapsulant.

In some embodiments, according to yet another aspect, an optical device package includes a carrier, a lid on the carrier, an optical device covered by the lid, and a wire. The lid includes a first transparent encapsulant and a metal member. The metal member includes a wall surrounding the first transparent encapsulant and a roof portion extended from the wall and on at least a portion of the first transparent encapsulant. The roof portion, the wall, the first transparent encapsulant and the carrier define a space under the roof portion. The wire is in the space and electrically connects the optical device to the carrier.

In some embodiments, according to still another aspect, a method is disclosed for manufacturing or packaging optical semiconductor device packages. The method includes: producing a metal lid panel including a plurality of metal members that are interconnected; disposing light-transmitting encapsulants on the metal members of the metal lid panel to form a plurality of metal lids of the metal lid panel; attaching the metal lids of the metal lid panel to a plurality of optical semiconductor devices to form a plurality of optical semiconductor device packages; and separating the optical semiconductor device packages by a singulation operation.

DETAILED DESCRIPTION

Figure 1A:
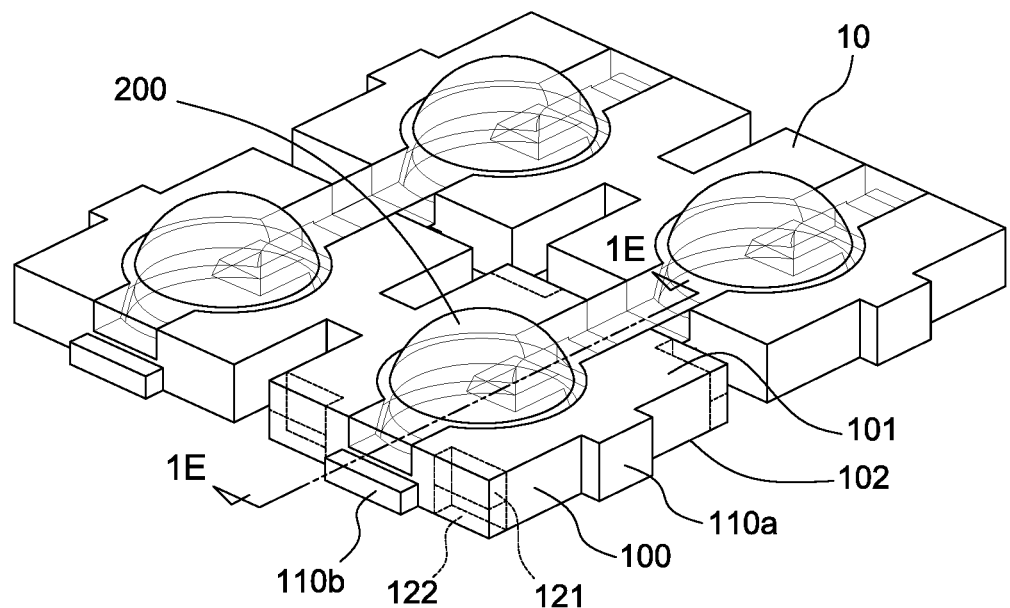
FIG. 1A illustrates a perspective view of an array of lids according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

At least some embodiments of the present disclosure relate to a method for manufacturing or packaging semiconductor device packages that achieves a low package height. A panel of metal lids is manufactured by an etching process operating on a strip metal sheet. The metal lids within the panel are interconnected via small bridges (also referred to as connection portions). Lenses (also referred to as transparent encapsulants or clear compounds) are formed on the metal lids by a transfer molding process. The whole lid panel, which includes the metal lids and the lenses are attached to an array of semiconductor devices (e.g., semiconductor dies) to form an array of semiconductor device packages. The semiconductor device packages are separated (singulated) by a singulation saw operation.

Conventional metal lids are individually formed. After attaching a lens to each convention metal lid, each conventional metal lid is individually picked and placed on a corresponding semiconductor device through a costly and time-consuming process. In contrast, the metal lids as disclosed herein are formed as a panel (or an array or a matrix) and are interconnected. The lenses are formed on the panel by a transfer molding process. The panel is then attached to the semiconductor devices at once. There is no additional attaching process for each individual lid. Therefore, the cost of the packaging process is reduced, comparing to a conventional packaging process involving the conventional metal lids.

The disclosed method can also achieve a very low thickness for the metal lid (e.g., less than approximately 0.2 mm) using the etching process and therefore achieves a very low package height. In contrast, conventional injected plastic lids cannot achieve such a low thickness, because thinner plastic lids lead to light leakage issues. Furthermore, the panel of metal lids can sustain a high molding pressure. As a result, lenses can be formed by disposing clear compound directly on the metal lids by a transfer molding process. The conventional plastic lids cannot sustain such a high molding pressure. Therefore, the clear compound cannot be molded directly on the convention plastic lids.

FIG. 1A is a perspective view of an array of lids in accordance with some embodiments of the present disclosure. The array of lids includes a plurality of lids 10. At least one of the lids 10 (also referred to as lens lids) includes a metal member 100 and a transparent encapsulant 200. The metal member 100 includes a top surface 101 and a bottom surface 102, and connection portions 110a and 110b. At least one corner of the metal member 100 includes a top corner portion 121 and a bottom corner portion 122. The lid 10 is connected to the other lids 10 through the connection portions 110a and 110b.

The transparent encapsulant 200 may be surrounded by the metal member 100. In some embodiments, the transparent encapsulant 200 may be integrally molded in the metal member 100. In some embodiment, the transparent encapsulant 200 may encapsulate the metal member 100. The transparent encapsulant 200 may extend over the top surface 101 of the metal member 100. Although the encapsulant 200 as illustrated in FIG. 1A is transparent, in some alternative embodiments the encapsulant 200 may be translucent or generally light-transmissive.

In some embodiments, the metal member 100 may have a thickness from approximately 1 mm to approximately 0.05 mm. In some embodiments, the metal member 100 may block the light. For example, the metal member 100 may include opaque (non-transparent) material. Thus, light does not pass through the metal member 100.

Figure 1B:
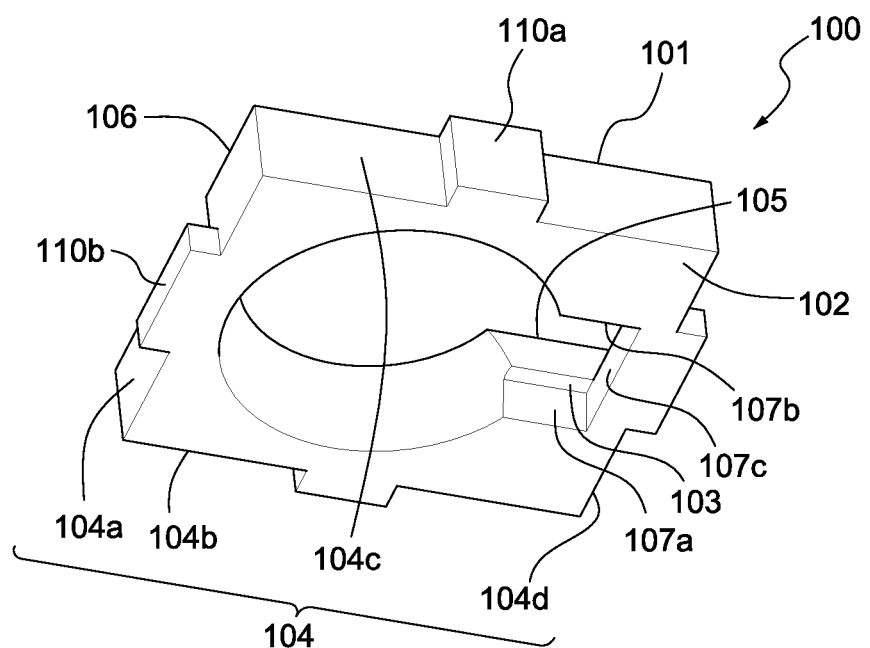
FIG. 1B illustrates a perspective view of a metal member of a lid according to some embodiments of the present disclosure.

The array of lids includes a plurality of metal members. FIG. 1B is a perspective view of a metal member 100 of a lid 10 according to some embodiments of the present disclosure. The metal member 100 includes the top surface 101, a first bottom surface 102, a second bottom surface 103, and a side surface 104. The top surface 101 defines a top opening. The first bottom surface 102 defines a bottom opening. In some embodiments, the bottom opening may be larger than the top opening. The second bottom surface 103 is between the top surface 101 and the first bottom surface 102.

Referring back to FIG. 1A, the transparent encapsulant 200 covers the second bottom surface 103.

Referring to FIG. 1B again, the side surface 104 includes a first side surface 104a, a second side surface 104b, a third side surface 104c, and a fourth side surface 104d. The connection portions 110a may be integrally connected to the second side surface 104b and the third side surface 104c. The connection portions 110b may be integrally connected to the first side surface 104a and the fourth side surface 104d.

The metal member 100 includes inner lower surface 107 and inner surface 108. The inner surface 107 includes a first inner lower surface 107a, a second inner lower surface 107b, and a third inner lower surface 107c. In some embodiments, the inner surface 108 may be an inclined surface. In some embodiments, the inner surface 108 may have a semi-tapered shape. The transparent encapsulant 200 may be in direct contact with the inner surface 108. The design of the inner surface 108 may prevent the transparent encapsulant 200 from falling out of the metal member 100.

In some embodiments, the metal member 100 may be formed by a pre-etching operation. The metal member 100 may be made of copper (Cu) or other suitable metal materials. The metal member 100 includes a roof portion 105 and a wall 106. The roof portion 105 extends from the wall 106. The transparent encapsulant 200 may be in direct contact with the roof portion 105 and may be disposed against the roof portion 105. Thus, the roof portion 105 is directly on at least a portion of the transparent encapsulant 200. In the lid structure as illustrated in FIG. 1A and FIG. 1B, the roof portion 105 mechanically blocks at least a portion of the transparent encapsulant 200 such that the transparent encapsulant 200 may not fall out of the metal member 100. The appearance of the wall 106 is defined by the top surface 101, the first bottom surface 102, the second bottom surface 103, and the side surface 104. The wall 106 laterally surrounds the transparent encapsulant 200.

Figure 1C:
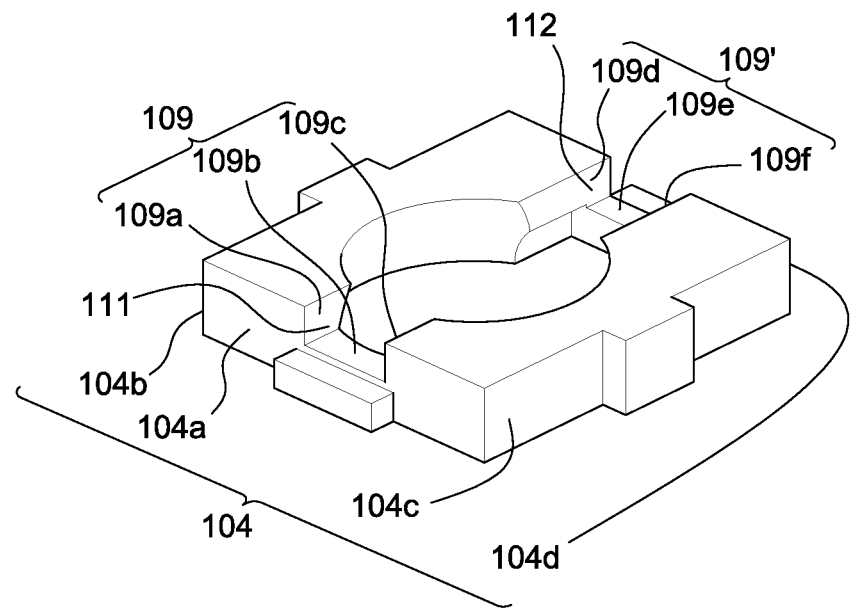
FIG. 1C illustrates a perspective view of a metal member of a lid according to some embodiments of the present disclosure.

FIG. 1C is a perspective view of a metal member 100 of a lid 10 according to some embodiments of the present disclosure. The metal member 100 includes inner upper surfaces 109 and 109'. The inner upper surface 109 includes a first inner upper surface 109a, a second inner upper surface 109b, and a third inner upper surface 109c. The inner upper surface 109' includes a fourth inner upper surface 109d, a fifth inner upper surface 109e, and a sixth inner upper surface 109f. The first inner upper surface 109a, the second inner upper surface 109b, and the third inner upper surface 109c define a first recess 111. The fourth inner upper surface 109d, the fifth inner upper surface 109e, and the sixth inner upper surface 109f define a second recess 112. The first recess 111 and the second recess 112 correspondingly define a runner along a horizontal direction.

Referring back to FIG. 1A, the first recess 111 and the second recess 112 of the metal member 100 may the support the transparent encapsulant 200.

Referring to FIG. 1C again, the first recess 111, the second recess 112, and the roof portion 105 of the metal member 100 may form a mold lock for holding the transparent encapsulant 200. In some embodiments, the depth of the recess 111 or 112 may be in a range from approximately 0.05 mm to approximately 0.15 mm. Preferably, the depth of the recess 111 or 112 may be about 0.1 mm. In some other embodiments, the depth of the recess 111 or 112 may be in a range from about 0.02 mm to about 0.2 mm. In yet some embodiments, the depth of the recess 111 or 112 may be in a range from about 0.01 mm to about 1.0 mm.

Figure 1D:
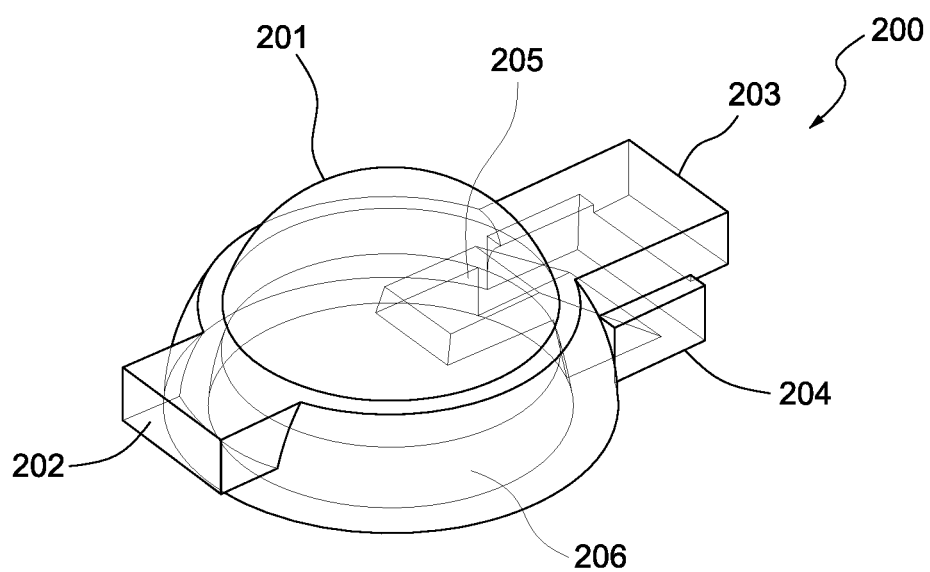
FIG. 1D illustrates a perspective view of a transparent encapsulant of a lid according to some embodiments of the present disclosure.

The lid 10 includes a metal member 100 as well as a transparent encapsulant 200. FIG. 1D is a perspective view of a transparent encapsulant 200 of a lid 10 according to some embodiments of the present disclosure. In some embodiments, the transparent encapsulant 200 may be formed by gel-injection operation. The transparent encapsulant 200 may include a lens structure. In some embodiments, the transparent encapsulant 200 may be formed of, or include, resin or other suitable materials.

The transparent or light-transmitting encapsulant 200 comprises an upper portion having a first width and a lower portion having a second width. In some embodiments, the second width may be greater than the first width. In some embodiments, a light having a wavelength of from approximately 380 nm to approximately 760 nm may pass through the transparent encapsulant 200 at a light transmittance of at least about 80%, at least about 85%, at least about 90%, or at least about 95%. In some embodiments, a light having a wavelength from approximately of 620 nm to approximately 760 nm may pass through the transparent encapsulant 200 at a light transmittance of at least about 80%, at least about 85%, at least about 90%, or at least about 95%. In some embodiments, a light having a wavelength of from approximately 495 nm to approximately 570 nm may pass through the transparent encapsulant 200 at a light transmittance of at least about 80%, at least about 85%, at least about 90%, or at least about 95%. In some embodiments, a light having a wavelength of from approximately 760 nm to approximately 20 um may pass through the transparent encapsulant 200 at a light transmittance of at least about 80%, at least about 85%, at least about 90%, or at least about 95%. In some embodiments, a light having a wavelength of from approximately 760 nm to approximately 1 mm may pass through the transparent encapsulant 200 at a light transmittance of at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, or at least about 95%. In some embodiments, a light having a wavelength of from approximately 190 nm to approximately 380 nm may pass through the transparent encapsulant 200 at a light transmittance of at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, or at least about 95%. In some embodiments, a light having a wavelength of from approximately 10 nm to approximately 380 nm may pass through the transparent encapsulant 200 at a light transmittance of at least about 30%, at least about 35%, at least about 40%, at least about 45%, at least about 50%, at least about 55%, at least about 60%, at least about 65%, at least about 70%, at least about 75%, at least about 80%, at least about 80%, at least about 85%, at least about 90%, or at least about 95%.

In some embodiments, the transparent encapsulant 200 may include a main body 201, a first extension 202, a second extension 203, and a bottom extension 204.

Referring to FIGS. 1A, 1B, 1C and FIG. 1D, the first extension 202 is over the bottom surface 102 of the wall 106 of the metal member 100 along a first horizontal direction. The first extension 202 may be exposed by the first side surface 104a of the wall 106 after a singulation process. The second extension 203 is over the bottom surface 102 of the wall 106 of the metal member 100 along a second horizontal direction, which is opposite to the first horizontal direction. The second extension 203 may be exposed by the fourth side surface 104d of the wall 106 after the singulation process. The first extension 202 and the second extension 203 are arranged along the runner that is correspondingly defined by the first recess 111 and the second recess 112 of the metal member 100.

Referring back to FIG. 1D, a first space 205 is defined by the second surface 103 of the roof portion 105 of the metal member 100 and the bottom extension 204 of the transparent encapsulant 200. A second space 206 is defined by the inner surface 108 of the metal member 100 and the main body 201 of the transparent encapsulant 200.

Figure 1E:
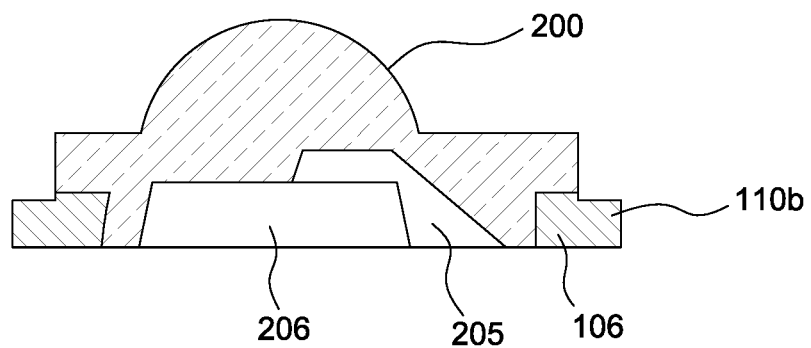
FIG. 1E illustrates a cross-sectional view of a lid according to some embodiments of the present disclosure.

FIG. 1E is a cross-sectional view of a lid 10 along the line 1E-1E shown in FIG. 1A, according to some embodiments of the present disclosure. The transparent encapsulant 200 is supported, at least partially, by the wall 106. In some embodiments, the lid 10 may be attached on a carrier. A bonding wire for electrically coupling the carrier may be disposed in the first space 205. A die that is on the carrier may be disposed in the second space 206. In some embodiments, the die may be an optical device (e.g., light-emitting diode (LED)) or a sensor.

Figure 1F:
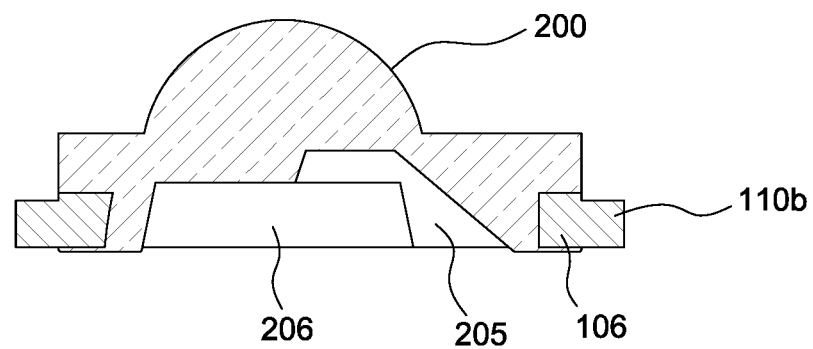
FIG. 1F illustrates a cross-sectional view of a lid according to some embodiments of the present disclosure.

FIG. 1F is a cross-sectional view of a lid 10 along the line 1E-1E shown in FIG. 1A according to some embodiments of the present disclosure. Except that a bottom portion of the transparent encapsulant 200 covers the first bottom surface 102 of the metal member 100, the structure of FIG. 1F is similar to that of FIG. 1E. In some embodiments, the bottom portion of the transparent encapsulant 200 is formed due to a gel-bleeding during the gel-injection operation.

Figure 2A:
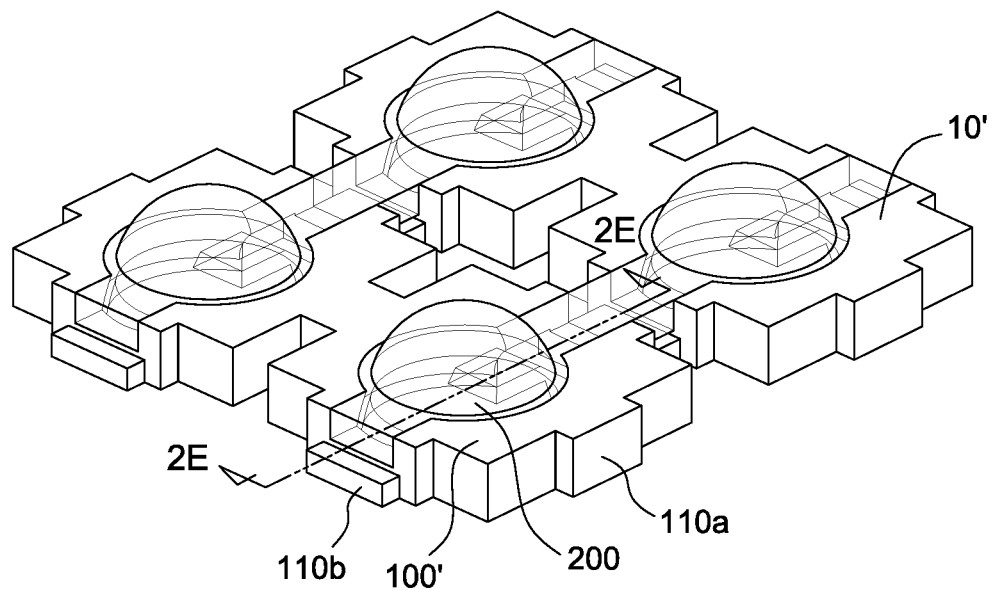
FIG. 2A illustrates a perspective view of an array of lids according to some embodiments of the present disclosure.

The shapes of the metal members of the lids may vary. For example, the metal members may include the top corner portions and the bottom corner portions in some embodiments, while may not include the top corner portions and the bottom corner portions in some other embodiments. FIG. 2A illustrates a perspective view of an array of lids according to some embodiments of the present disclosure. The array of lids includes a plurality of lids 10'. The depicted structure of FIG. 2A is similar to the structure depicted in FIG. 1A, except that the top corner portions 121 and the bottom corner portions 122 shown in FIG. 1A are removed from the structure depicted in FIG. 2A. During singulation operations, the process may cut the connection portions 110a and 110b or part of the side walls of the metal member 100' of the lids 10' using, e.g., saws. The structure of the lids 10' may reduce the consumptions of the saws during the singulation operations because the singulated portion is minimized in the structure of the lids 10'.

Figure 2B:
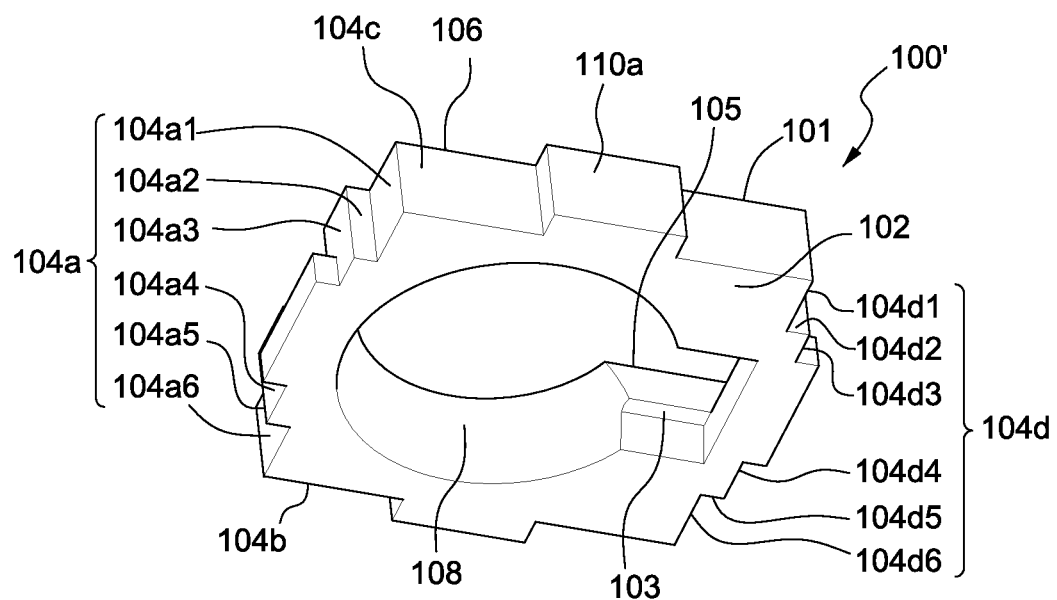
FIG. 2B illustrates a perspective view of a metal member of a lid according to some embodiments of the present disclosure.

FIG. 2B is a perspective view of a metal member 100' of a lid 10' according to some embodiments of the present disclosure. The depicted structure of FIG. 2B is similar to the structure depicted in FIG. 1B, except that the top corner portions 121 and the bottom corner portions 122 are removed from the structure depicted in FIG. 2B.

Figure 2C:
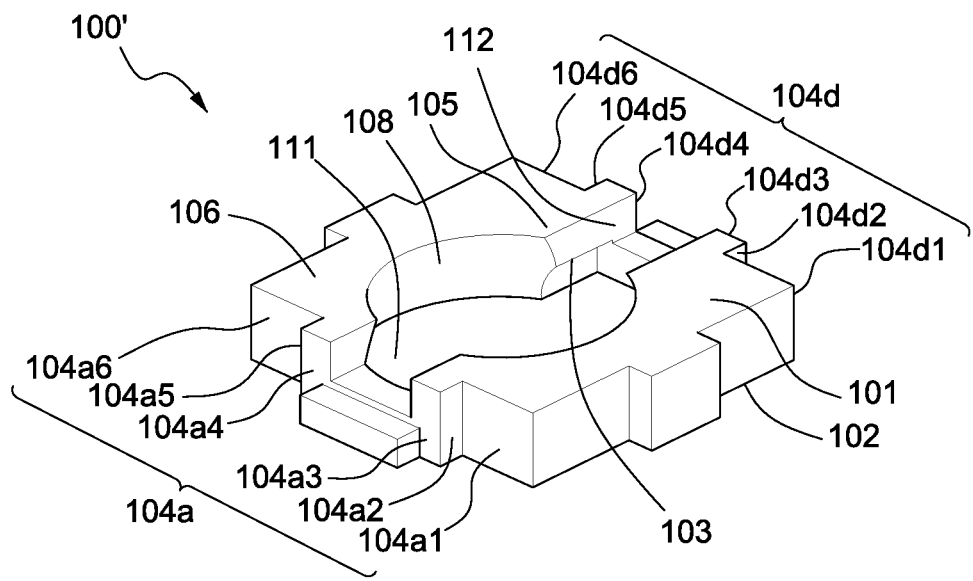
FIG. 2C illustrates a perspective view of a metal member of a lid according to some embodiments of the present disclosure.

FIG. 2C is a perspective view of a metal member 100' of a lid 10' according to some embodiments of the present disclosure. The depicted structure of FIG. 2C is similar to the structure depicted in FIG. 1C, except that the top corner portions 121 and the bottom corner portions 122 are removed from the structure depicted in FIG. 2C.

Figure 2D:
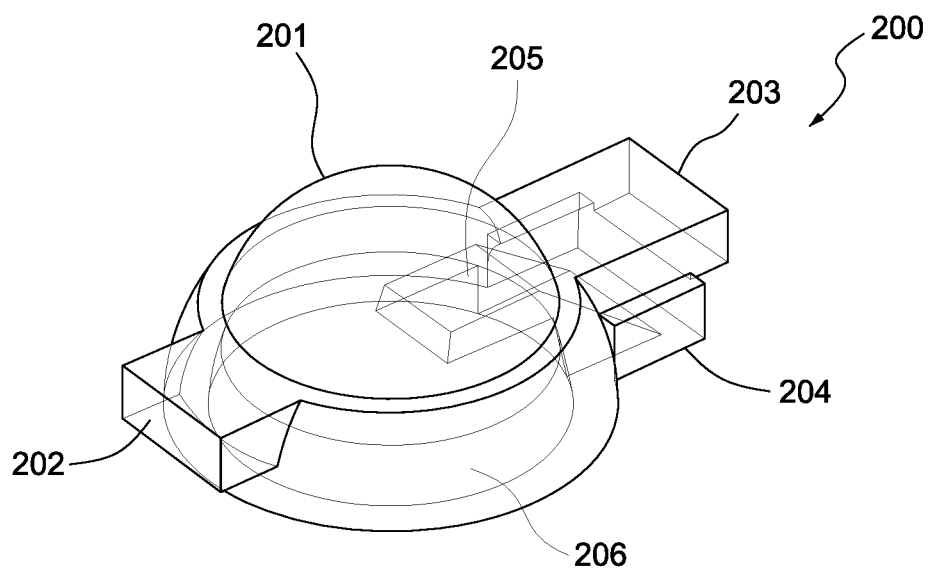
FIG. 2D illustrates a perspective view of a transparent encapsulant of a lid according to some embodiments of the present disclosure.

FIG. 2D illustrates a perspective view of a transparent encapsulant 200 of a lid 10' according to some embodiments of the present disclosure. The depicted structure of FIG. 2D is the same as the structure depicted in FIG. 1D.

Figure 2E:
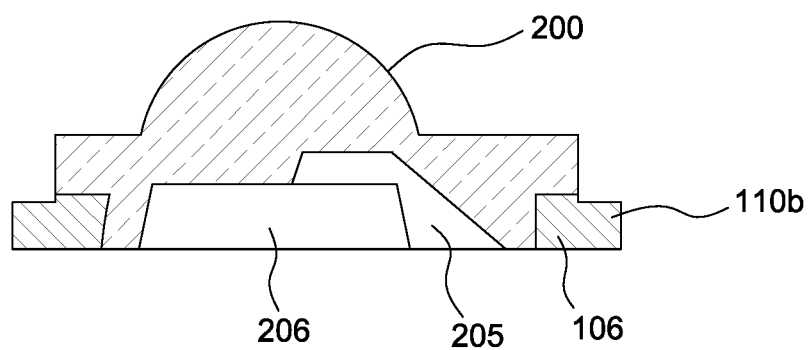
FIG. 2E illustrates a cross-sectional view of a lid according to some embodiments of the present disclosure.

FIG. 2E is a cross-sectional view of a lid 10' along the line 2E-2E shown in FIG. 2A according to some embodiments of the present disclosure. The depicted cross-sectional structure of FIG. 2E is the same as the structure depicted in FIG. 1E.

Figure 2F:
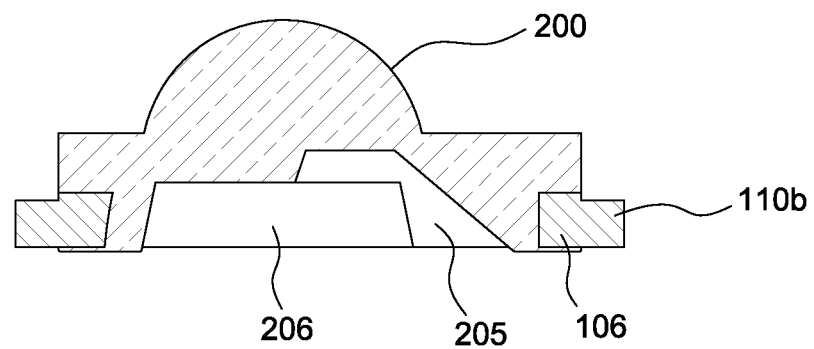
FIG. 2F illustrates a cross-sectional view of a lid according to some embodiments of the present disclosure.

FIG. 2F is a cross-sectional view of a lid 10' along the line 2E-2E shown in FIG. 2A according to some embodiments of the present disclosure. The depicted cross-sectional structure of FIG. 2F is the same as the structure depicted in FIG. 1F.

Figure 3A:
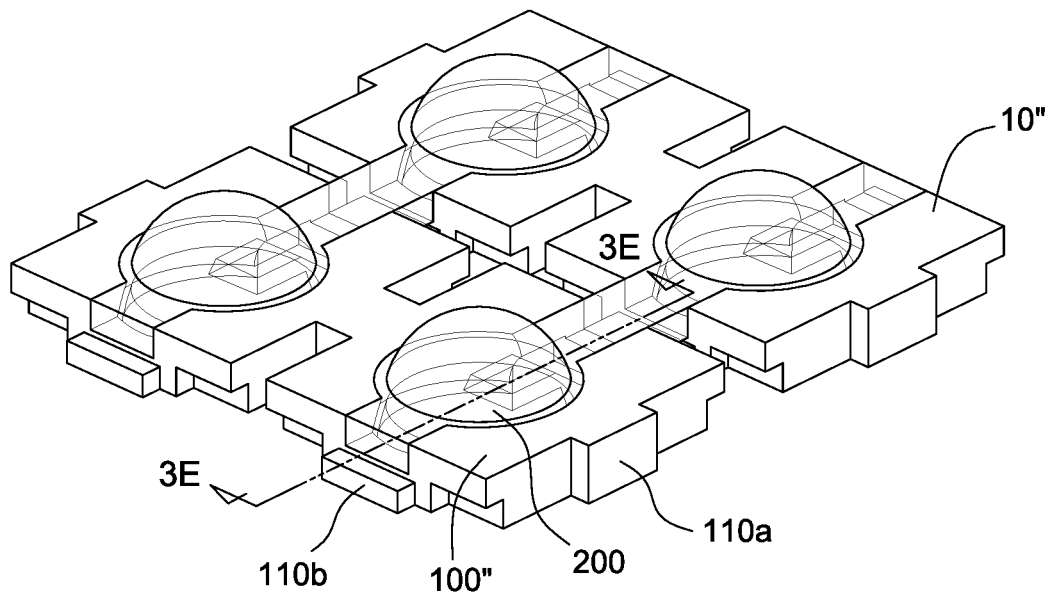
FIG. 3A illustrates a perspective view of an array of lids according to some embodiments of the present disclosure.

The metal members may include the bottom corner portions in some embodiments, while may not include the bottom corner portions in some other embodiments. FIG. 3A illustrates a perspective view of an array of lids according to some embodiments of the present disclosure. The array of lids includes a plurality of lids 10". The depicted structure of FIG. 3A is similar to the structure depicted in FIG. 1A, except that the bottom corner portions 122 shown in FIG. 1A are removed from the structure depicted in FIG. 3A. The structure of the lids 10" may help reducing the consumptions of the saws during the singulation operations because the singulated portion is reduced or eliminated from the structure. Additionally, since the structure of FIG. 3A still keeps the top corner portions 122 as shown in FIG. 1A, the gel may not bleed during the gel-injection operation.

Figure 3B:
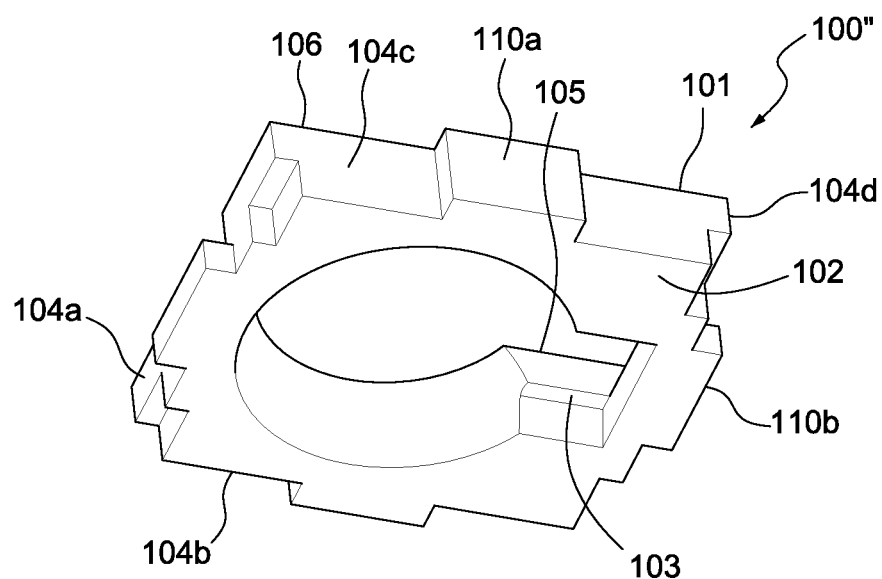
FIG. 3B illustrates a perspective view of a metal member of a lid according to some embodiments of the present disclosure.

FIG. 3B is a perspective view of a metal member 100" of a lid 10" according to some embodiments of the present disclosure. The depicted structure of FIG. 3B is similar to the structure depicted in FIG. 1B, except that the bottom corner portions 122 are removed from the structure depicted in FIG. 3B.

Figure 3C:
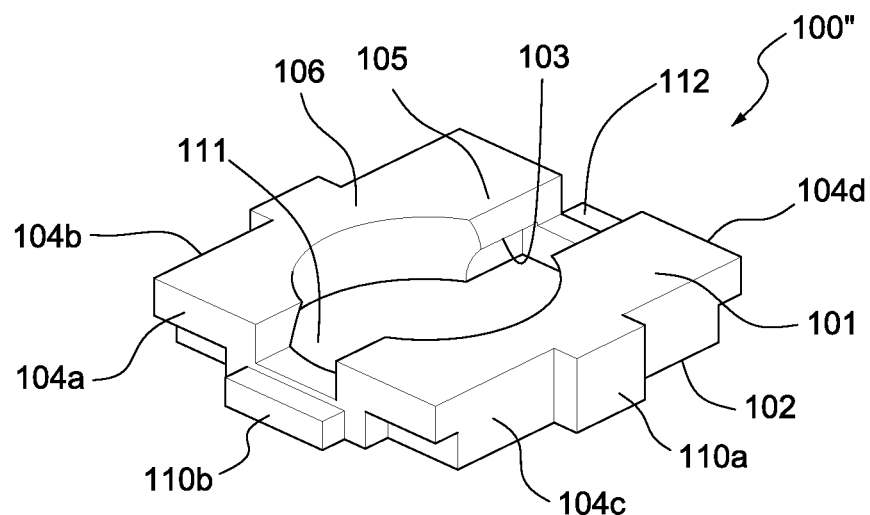
FIG. 3C illustrates a perspective view of a metal member of a lid according to some embodiments of the present disclosure.

FIG. 3C is a perspective view of a metal member 100" of a lid 10" according to some embodiments of the present disclosure. The depicted structure of FIG. 3C is similar to the structure depicted in FIG. 1C, except that the bottom corner portions 122 are removed from the structure depicted in FIG. 3C.

Figure 3D:
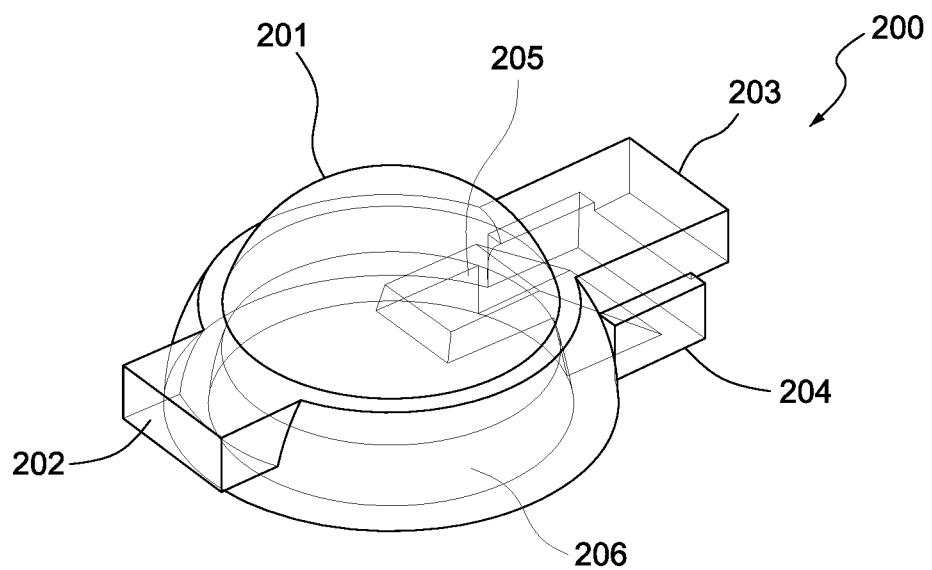
FIG. 3D illustrates a perspective view of a transparent encapsulant of a lid according to some embodiments of the present disclosure.

FIG. 3D illustrates a perspective view of a transparent encapsulant 200 of a lid 10" according to some embodiments of the present disclosure. The depicted structure of FIG. 3D is the same as the structure depicted in FIG. 1D.

Figure 3E:
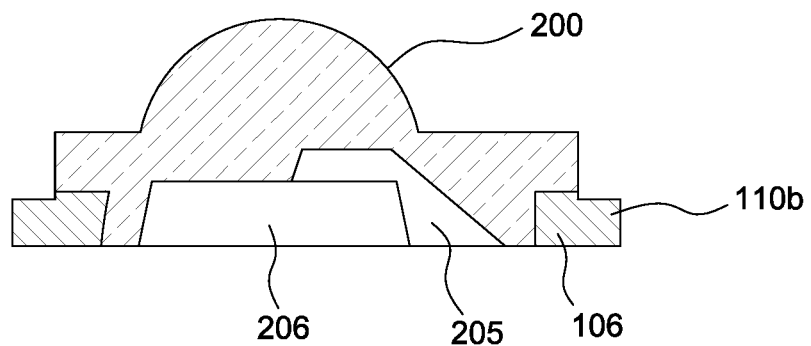
FIG. 3E illustrates a cross-sectional view of a lid according to some embodiments of the present disclosure.

FIG. 3E is a cross-sectional view of a lid 10" along the line 3E-3E shown in FIG. 3A according to some embodiments of the present disclosure. The depicted cross-sectional structure of FIG. 3E is the same as the structure depicted in FIG. 1E.

Figure 3F:
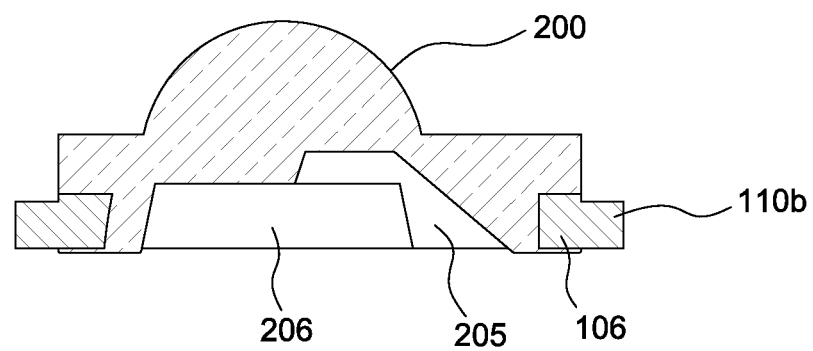
FIG. 3F illustrates a cross-sectional view of a lid according to some embodiments of the present disclosure.

FIG. 3F is a cross-sectional view of a lid 10' along the line 3E-3E shown in FIG. 3A according to some embodiments of the present disclosure. The depicted cross-sectional structure of FIG. 3F is the same as the structure depicted in FIG. 1F.

Figure 4:
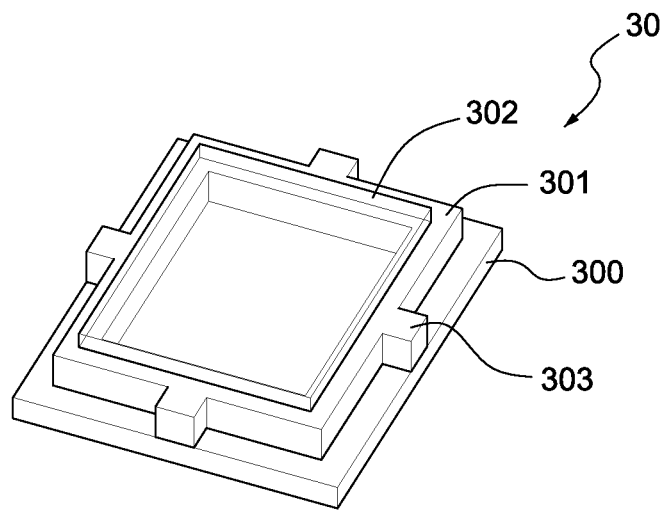
FIG. 4 illustrates a perspective view of an optical device package according to some embodiments of the present disclosure.

In some embodiments, for optical device packages, the packages may include optical elements (e.g., lens or glass) for transmitting light. FIG. 4 illustrates a perspective view of an optical device package 30 according to some embodiments of the present disclosure. The optical device package 30 includes a carrier 300, a metal member 301, and a glass layer 302. The carrier 300 may be, or include, a printed circuit board, such as a paper-based copper foil laminate, a composite copper foil laminate, or a polymer-impregnated glass-fiber-based copper foil laminate. In some embodiments, an optical device or a sensor may be disposed on the carrier 300.

The metal member 301 is disposed on the carrier 300. The metal member 301 may be formed of, or include, copper or other suitable metal materials. The thickness of the metal member 301 may be in a range from approximately 1 mm to approximately 0.05 mm. In some embodiments, the metal member 301 may block the light. For example, the metal member 301 may include opaque (non-transparent) material. Thus, light does not pass through the metal member 301.

The metal member 301 may include connection portions 303. The glass layer 302 is disposed on the metal member 301 using an adhesive. The glass layer 302 may include a wall extending from the bottom surface to the carrier 300. In some embodiments, the wall is not in direct contact with the carrier 300.

Figure 5:
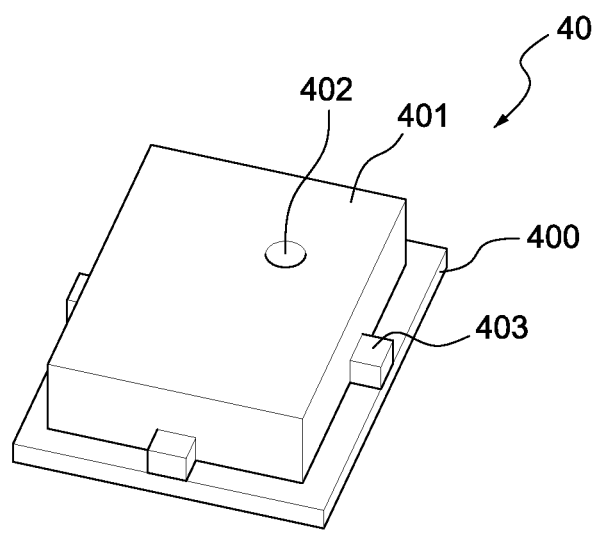
FIG. 5 illustrates a perspective view of a device package according to some embodiments of the present disclosure.

In some embodiments, optical device packages may include a hole on the package surface for transmitting light. FIG. 5 illustrates a perspective view of a device package 40 according to some embodiments of the present disclosure. The device package 40 includes a carrier 400 and a metal member 401. The metal member 401 includes a hole 402 on the top surface and connection portions 403. In some embodiments, the metal member 401 may include a wall extending from the top surface to the carrier 400. In some embodiments, the wall is not in direct contact with the carrier 400.

Figure 6A:
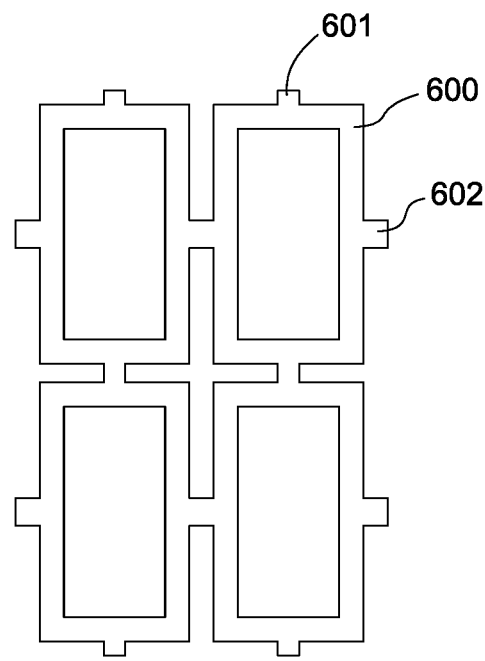
FIG. 6A illustrates a top view of an array of metal members according to some embodiments of the present disclosure.

In some embodiments, the array of metal members may be interconnected to each other through connection portions. FIG. 6A illustrates a top view of an array of metal members according to some embodiments of the present disclosure. The metal member 600 includes connection portions 601 and 602. Each metal member 600 of the array is connected to at least another metal member 600 of the array through the connection portions 601 and/or 602. The design of the array of metal members can eliminate the burr phenomenon which occurs during singulation operations. Due to the design of the array of metal members, the consumptions of saws may be reduced because only the connection portions 601 and 602 need to be cut through for separation of the metal members. In some embodiments, the thickness of the connection portions 601 and 602 may vary depending on the size of the metal member 600.

Figure 6B:
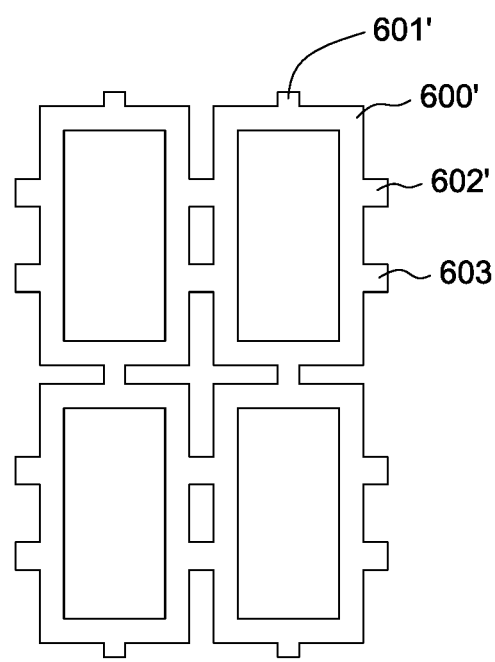
FIG. 6B illustrates a top view of an array of metal members according to some embodiments of the present disclosure.

In some embodiments, the number of connection portions may vary. FIG. 6B illustrates a top view of an array of metal members according to some embodiments of the present disclosure. The depicted structure of FIG. 6B is similar to the structure depicted in FIG. 6A, except that the metal member 600' further includes connection portions 603.

Figure 7A:
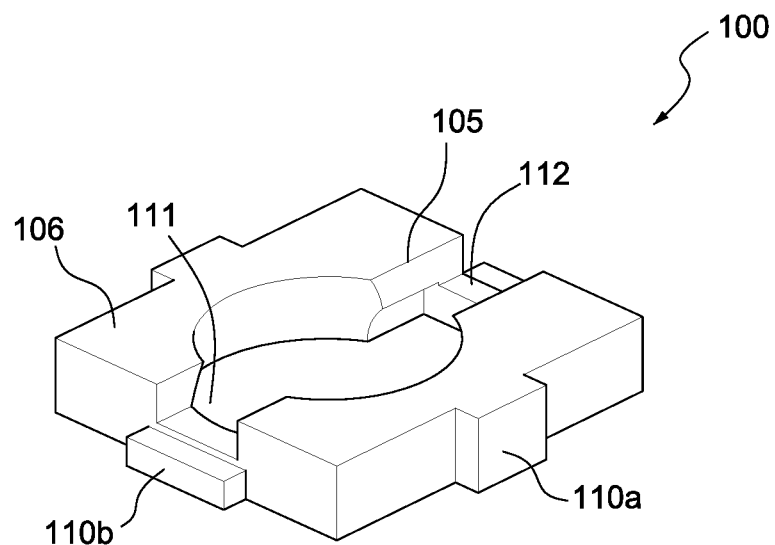
FIG. 7A illustrates a perspective view of a metal member of a lid in accordance with some embodiments of the present disclosure.

In some embodiments, the lid may be manufactured by an etching operation for forming the metal member and a molding operation for forming the transparent encapsulant. FIG. 7A illustrates a perspective view of a metal member 100 of a lid 10 in accordance with some embodiments of the present disclosure. In some embodiments, the metal member 100 is formed by an etching operation. After the pre-etching operation, an aperture and a runner (which is correspondingly defined by the two recesses 111 and 112) are formed in the metal member 100. The aperture has a top opening and a bottom opening. The bottom opening is larger than the top opening. The metal member 100 includes a roof portion 105 and a wall 106. The roof portion 105 extends from the wall 106. The metal member 100 has a mold lock mechanism for keep a transparent encapsulant (e.g. the transparent encapsulant 200 shown in FIG. 1A) from falling out. For example, the transparent encapsulant is locked in the aperture through the roof portion 105 and is supported at the two recesses 111 and 112 by the wall 106. In some embodiments, the appearance of the metal member 100 may vary according to different designs or needs.

Figure 7B:
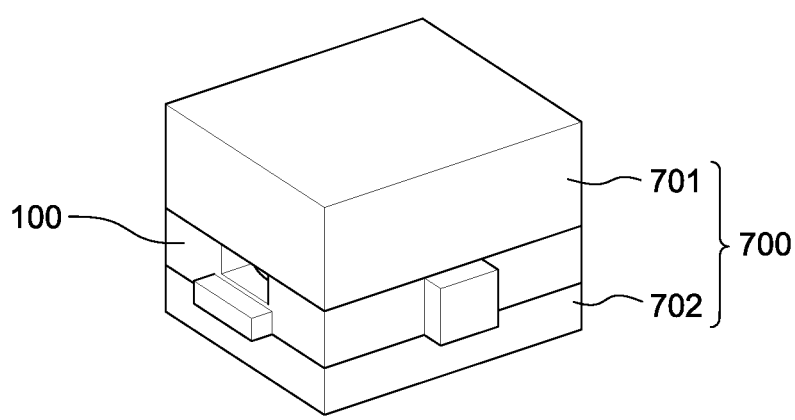
FIG. 7B illustrates a perspective view of a metal member of a lid in a mold chase according to some embodiments of the present disclosure.

FIG. 7B illustrates a perspective view of a metal member 100 of a lid 10 in a mold chase 700 in accordance with some embodiments of the present disclosure. The mold chase 700 includes an upper mold portion 701 and a lower mold portion 702. The metal member 100 is disposed between the upper mold portion 701 and the lower mold portion 702 during a molding operation. The first recess 111 and the second recess 112 are exposed such that during a gel-injection operation, an inlet nozzle may be arranged in proximity to one of the recesses 111 and 112 and the gel may be injected from the inlet nozzle to a molding space, which is defined by the upper mold portion 701, the lower mold portion 702, and the metal member 100 disposed between the upper mold portion 701 and the lower mold portion 702. The structural stability of the metal member 100 is high enough to sustain the molding pressure applied by the mold chase 700.

Figure 7C:
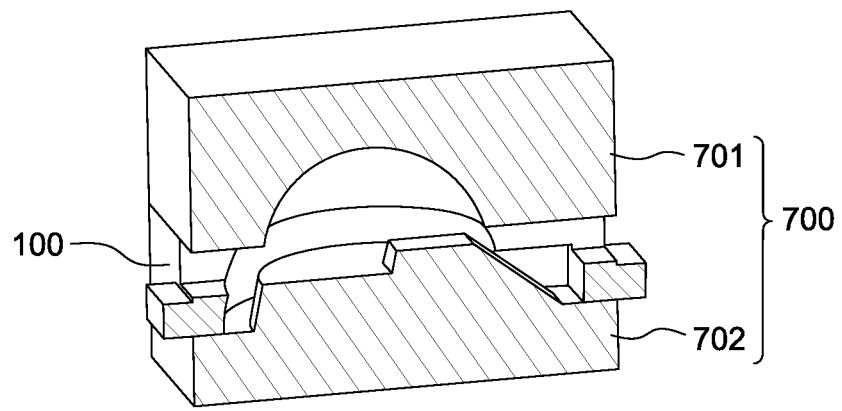
FIG. 7C illustrates a cross-sectional view of a metal member of a lid in a mold chase according to some embodiments of the present disclosure.

FIG. 7C illustrates a cross-sectional view of a metal member 100 of a lid 10 in a mold chase 700 in accordance with some embodiments of the present disclosure. The injected gel would fill the space that is defined among the metal member 100 and the mold chase 700 during the gel-injection operation. Then the gel that fills the space is cured during a curing operation. After the curing operation, a transparent encapsulant (e.g. the transparent encapsulant 200 shown in FIG. 1A) is formed.

Figure 7D:
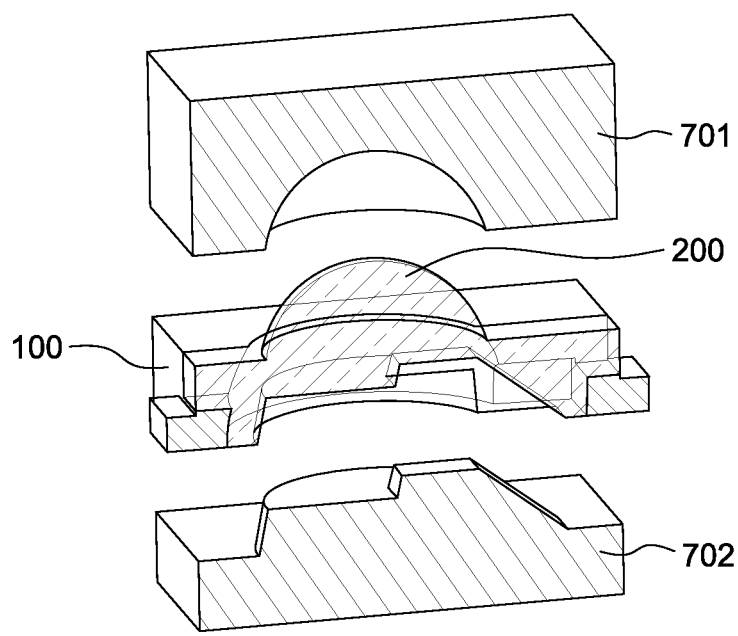
FIG. 7D illustrates an exploded cross-sectional view of a lid and a mold chase according to some embodiments of the present disclosure.

FIG. 7D illustrates an exploded view cross-sectional of a lid 10 and a mold chase 700 in accordance with some embodiments of the present disclosure. The mold chase 700 is removed during a demolding operation after the transparent encapsulant 200 is formed and integrally molded by the mold lock structure of the metal member 100.

Figure 7E:
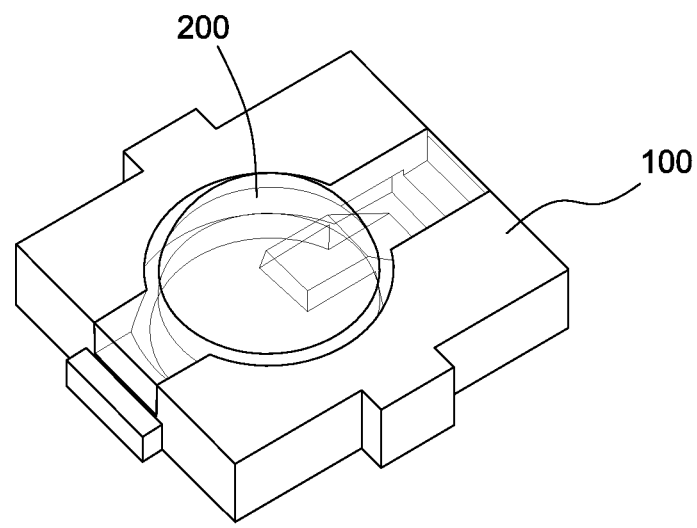
FIG. 7E illustrates a perspective view of a lid according to some embodiments of the present disclosure.

FIG. 7E illustrates a perspective view of a lid 10 in accordance with some embodiments of the present disclosure. Upon removing the mold chase 700, the formation of the lid 10 is completed. Although FIG. 7E merely shows one lid, persons skilled in the art may clearly and unambiguously appreciate that an array of lids may be formed through the same operations.

Figure 8A:
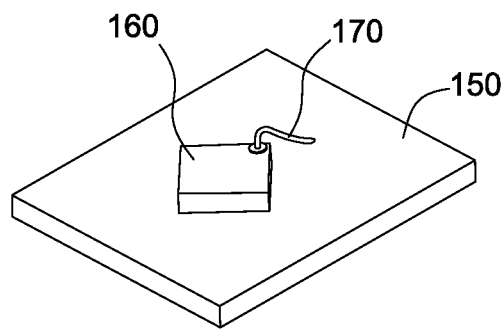
FIG. 8A illustrates a perspective view of a carrier and a device disposed on the carrier according to some embodiments of the present disclosure.

In some embodiments, a semiconductor device package may include a semiconductor device disposed on a carrier and a lid that covers the semiconductor device. FIG. 8A illustrates a perspective view of a carrier 150 and a semiconductor device 160 disposed on the carrier 150 in accordance with some embodiments of the present disclosure. In some embodiments, the carrier 150 may be or include, for example, a printed circuit board, such as a paper-based copper foil laminate, a composite copper foil laminate, or a polymer-impregnated glass-fiber-based copper foil laminate. The carrier 150 may include an interconnection structure, such as a redistribution layer (RDL) or a grounding element. In some embodiments, the grounding element is a via that is exposed from a lateral surface of the carrier 150. In some embodiments, the grounding element is a metal layer exposed from the lateral surface of the carrier 150. In some embodiments, the grounding element is a metal trace exposed from the lateral surface of the carrier 150. The semiconductor device 160 is disposed on the carrier 150. The semiconductor device 160 may be an optical device or a sensor. In some embodiments, a bonding wire 170 electrically connects the semiconductor device 160 to the carrier 150.

Figure 8B:
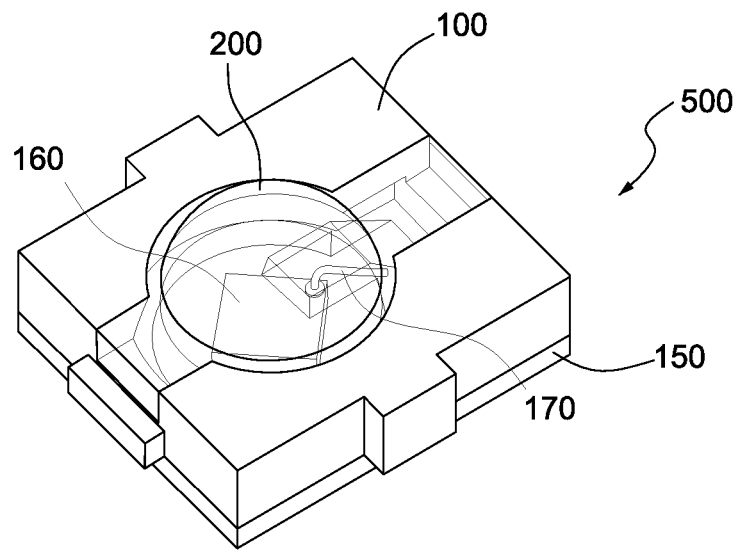
FIG. 8B illustrates perspective view of a semiconductor device package according to some embodiments of the present disclosure.

FIG. 8B illustrates perspective view of a semiconductor device package 500 in accordance with some embodiments of the present disclosure. In some embodiments, the lid 10 is attached on the carrier 150 by using, e.g., an adhesive. The semiconductor device package 500 includes the carrier 150, the lid 10, the semiconductor device 160, and the bonding wire 170.

Figure 9:
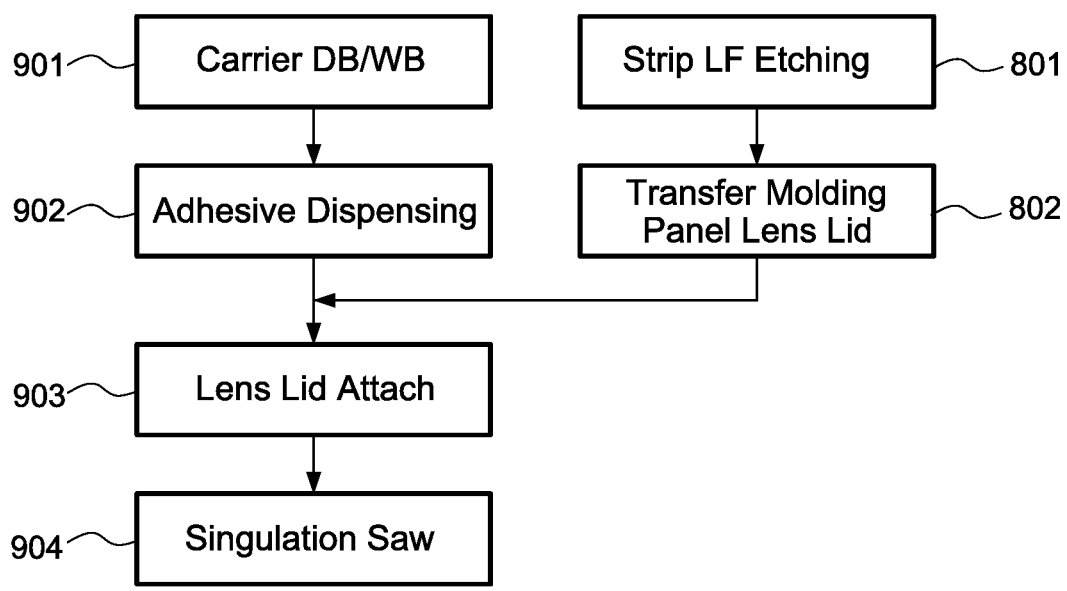
FIG. 9 illustrates a method of manufacturing a semiconductor device package according to some embodiments of the present disclosure.

FIG. 9 illustrates a flowchart for a process of manufacturing a semiconductor device package according to some embodiments of the present disclosure. At block 801, an array of metal members is formed by a pre-etching operation. In some embodiments, the metal members are formed by etching on a strip metal sheet. The metal members are interconnected by connection portions (e.g., connection portions 601 and 602 as shown in FIG. 6A) and form a metal lid panel. In some embodiments, the thickness of the metal members is less than or equal to 0.2 millimeter.

At block 802, the array of metal members is disposed between molds in a molding operation. Then, during a transfer molding process, a transparent encapsulant is correspondingly formed in each metal member of the array of metal members through a gel-injection operation and curing operation. In some alternative embodiments, the transparent encapsulant may be formed by using a screen printing operation. After a demolding operation for removing the mold(s), an array of lids (lens lids) comprising the metal members and the transparent encapsulants is formed. Each of the lids includes a transparent encapsulant and a metal member.

At block 901, one or more carriers are provided. In some embodiments, during a process of device bonding (DB) and wire bonding (WB), one or more semiconductor devices and one or more bonding wire may be disposed on one or more carriers. At block 902, an adhesive is dispensed (applied) on the carrier. At block 903, the lid is attached onto the carrier. In some embodiments where the lids are formed as an array, the array of lids is attached onto an array of carriers. At block 904, each semiconductor device package is singulated by performing a singulation operation. For example, the device packages may be separated (singulated) by, e.g., using saws to cut through the connection portions of the lid panel. In some embodiments, the operations of the blocks 801 and 802 and the operations of the blocks 901 and 902 depicted in FIG. 9 may, but need not, be performed concurrently.

Figure 10A:
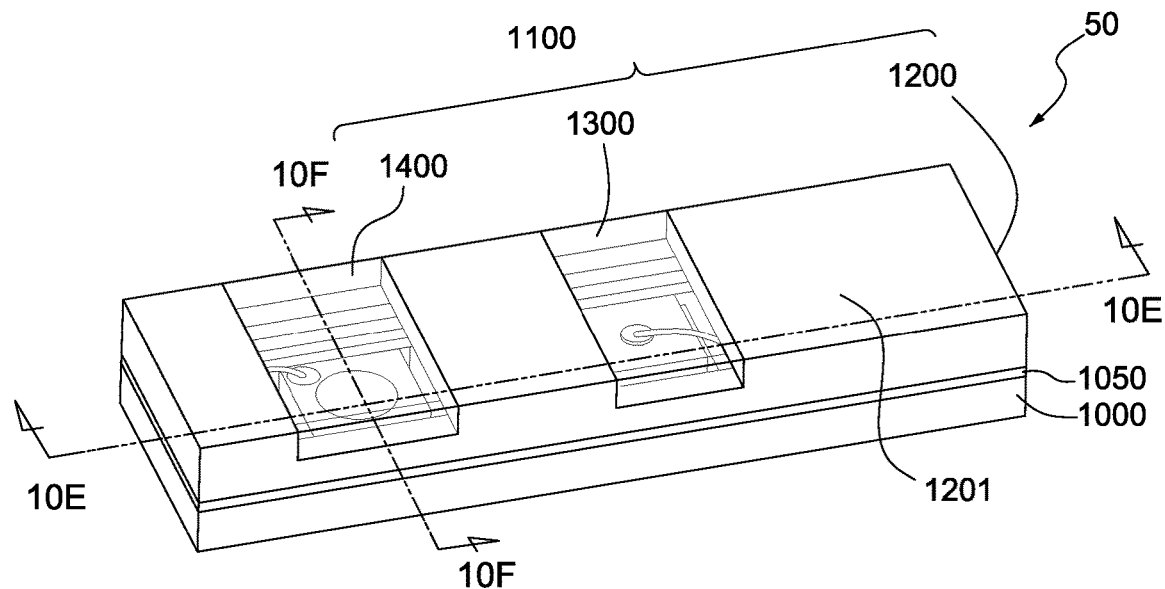
FIG. 10A illustrates a perspective view of a semiconductor device package according to some embodiments of the present disclosure.

In some embodiments, a semiconductor device package may include multiple semiconductor devices and a lid of the semiconductor device package may include multiple transparent encapsulants. FIG. 10A illustrates a perspective view of a semiconductor device package 50 according to some embodiments of the present disclosure. The semiconductor device package 50 includes a carrier 1000, an adhesive 1050, and a lid 1100. In some embodiments, one or more semiconductor devices and one or more bonding wire may be disposed on the carrier 1000. The lid 1100 includes a metal member 1200 and transparent encapsulants 1300 and 1400. In some embodiments, the metal member 1200 may be formed through an etching operation. The thickness of the metal member 1200 may be in a range from approximately 1 mm to approximately 0.05 mm. The metal member 1200 may block the light. The metal member 1200 may include opaque or non-transparent material. Thus, light does not pass through the metal member 1200. The top surface 1201 of the metal member 1200 is coplanar with the top surface of the transparent encapsulants 1300 and the top surface of the transparent encapsulants 1400. The transparent encapsulants 1300 and 1400 are separated by the metal member 1200 and are laterally surrounded by the metal member 1200.

Figure 10B:
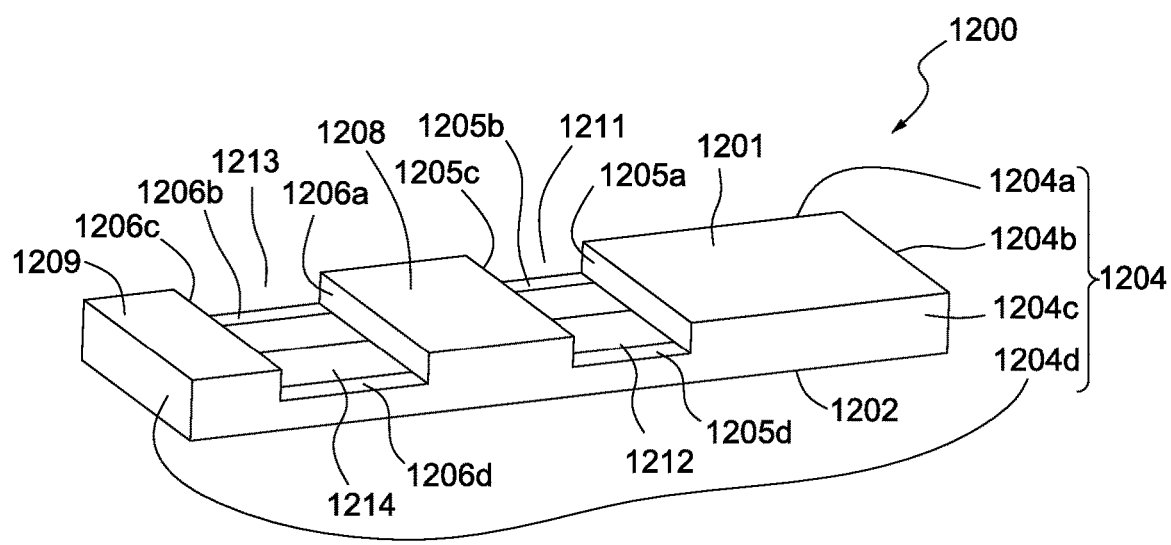
FIG. 10B illustrates a perspective view of a metal member of a lid according to some embodiments of the present disclosure.

FIG. 10B illustrates a perspective view of a metal member 1200 of a lid 1100 according to some embodiments of the present disclosure. The metal member 1200 includes the top surface 1201, a first bottom surface 1202, a second bottom surface 1203 (as shown in FIG. 10E), and a side surface 1204. In some embodiments, the top surface 101 has two top openings. The first bottom surface 102 has a bottom opening. The area of the bottom opening is larger than the areas of the two top openings. The second bottom surface 1203 is between the top surface 1201 and the first bottom surface 1202.

As shown in FIG. 10B, the side surface 104 includes a first side surface 1204a, a second side surface 1204b, a third side surface 1204c, and a fourth side surface 1204d. The metal member 1200 includes inner surfaces 1205a, 1205b, 1205c, and 1205d and inner surfaces 1206a, 1206b, 1206c, and 1206d. The inner surfaces 1205a, 1205b, and 1205c define a first recess 1211. The inner surfaces 1205a, 1205c, and 1205d define a second recess 1212. The first recess 1211 and the second recess 1212 correspondingly define a first runner along a first horizontal direction. The inner surfaces 1206a, 1206b, and 1206c define a third recess 1213. The inner surfaces 1206a, 1206c, and 1206d define a fourth recess 1214. The third recess 1213 and the fourth recess 1214 correspondingly define a second runner along a second horizontal direction. In some embodiments, the first and second horizontal directions are the same direction. In other words, the first and second runners are parallel to each other.

Referring back to FIG. 10A, the transparent encapsulant 1300 is supported by the metal member 1200 at the first recess 1211 and the second recess 1212. The transparent encapsulant 1400 is further supported by the metal member 1200 at the third recess 1213 and the fourth recess 1214.

In some embodiments, the metal member 100 may be formed of, or include, copper (Cu) or other suitable metal materials. The metal member 1200 includes a roof portion 1208 and a wall 1209. The roof portion 1208 extends from the first side surface 1204a to the third side surface 1204c.

Figure 10C:
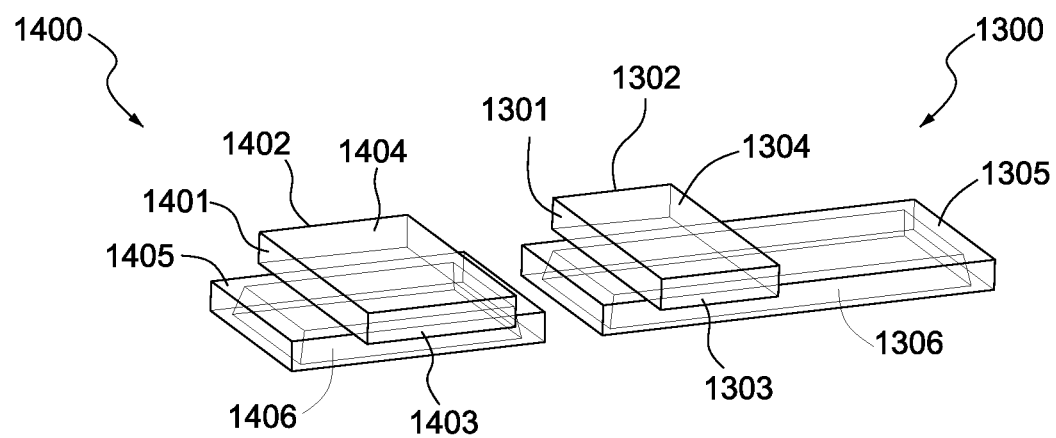
FIG. 10C illustrates a perspective view of a transparent encapsulant of a lid according to some embodiments of the present disclosure.

FIG. 10C is a perspective view of transparent encapsulants 1300 and 1400 of a lid 1100 according to some embodiments of the present disclosure. The transparent encapsulants 1300 and 1400 are formed by gel-injection operation(s). In some embodiments, each of the transparent encapsulants 1300 and 1400 has a lens structure. In some embodiments, the transparent encapsulants 1300 and 1400 may be formed of, or include, resin or other suitable materials.

In some embodiments, a light having a wavelength of from approximately 380 nm to approximately 760 nm may pass through the transparent encapsulant 1300 or 1400 at a light transmittance of at least about 80%, at least about 85%, at least about 90%, or at least about 95%. In some embodiments, a light having a wavelength of from approximately 620 nm to approximately 760 nm may pass through the transparent encapsulant 1300 or 1400 at a light transmittance of at least about 80%, at least about 85%, at least about 90%, or at least about 95%. In some embodiments, a light having a wavelength of from approximately 495 nm to approximately 570 nm may pass through the transparent encapsulant 1300 or 1400 at a light transmittance of at least about 80%, at least about 85%, at least about 90%, or at least about 95%. In some embodiments, a light having a wavelength of from approximately 760 nm to approximately 20 um may pass through the transparent encapsulant 200 at a light transmittance of at least about 80%, at least about 85%, at least about 90%, or at least about 95%. In some embodiments, a light having a wavelength of from approximately 760 nm to approximately 1 mm may pass through the transparent encapsulant 1300 or 1400 at a light transmittance of at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, or at least about 95%. In some embodiments, a light having a wavelength of from approximately 190 nm to approximately 380 nm may pass through the transparent encapsulant 200 at a light transmittance of at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, or at least about 95%. In some embodiments, a light having a wavelength in a range from approximately 10 nm to approximately 380 nm may pass through the transparent encapsulant 1300 or 1400 at a light transmittance of at least about 80%, at least about 85%, at least about 90%, or at least about 95%.

The transparent encapsulant 1300 includes an upper portion 1301 and a lower portion 1305. The upper portion 1301 has a first extension 1302, a second extension 1303, and a top surface 1304. In some embodiments, the width of the lower portion 1305 may be greater than the width of the upper portion 1301.

Referring back to FIG. 10B, the first extension 1302 is over the bottom of the wall 1209 of the metal member 1200 along a first horizontal direction and may be exposed by the first side surface 1204a of the wall 1209 after a singulation process. The second extension 1303 is over the bottom of the wall 1209 of the metal member 1200 along a second horizontal direction, which is opposite to the first horizontal direction. The second extension 1303 may be exposed by the third side surface 1204c of the wall 1209 after a singulation process. A space 1306 is defined by the metal member 1200 and the lower portion 1305 of the transparent encapsulant 1300.

Similar to the structure of the transparent encapsulant 1300, the transparent encapsulant 1400 includes an upper portion 1401 and a lower portion 1405. The upper portion 1401 has a first extension 1402, a second extension 1403, and a top surface 1404.

The first extension 1402 is over the bottom of the wall 1209 of the metal member 1200 along a first horizontal direction and may be exposed by the first side surface 1204a of the wall 1209 after a singulation process. The second extension 1403 is over the bottom of the wall 1209 of the metal member 1200 along a second horizontal direction, which is opposite to the first horizontal direction. The second extension 1403 may be exposed by the third side surface 1204c of the wall 1209 after a singulation process. A space 1406 is defined by the metal member 1200 and the lower portion 1405 of the transparent encapsulant 1400.

Figure 10D:
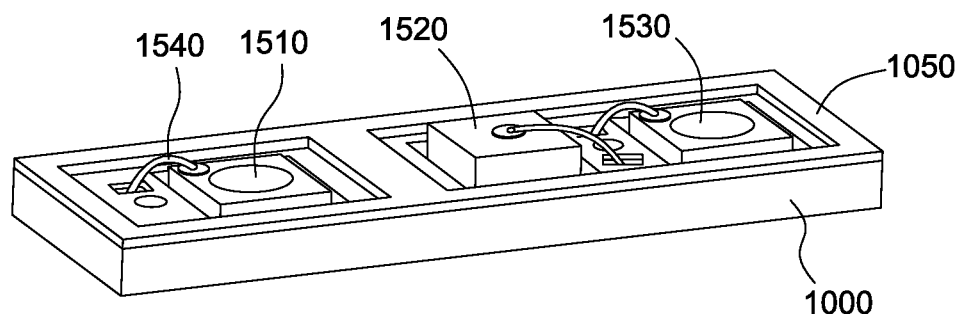
FIG. 10D illustrates a perspective view of an intermediate product of a semiconductor device package according to some embodiments of the present disclosure.
Figure 10E:
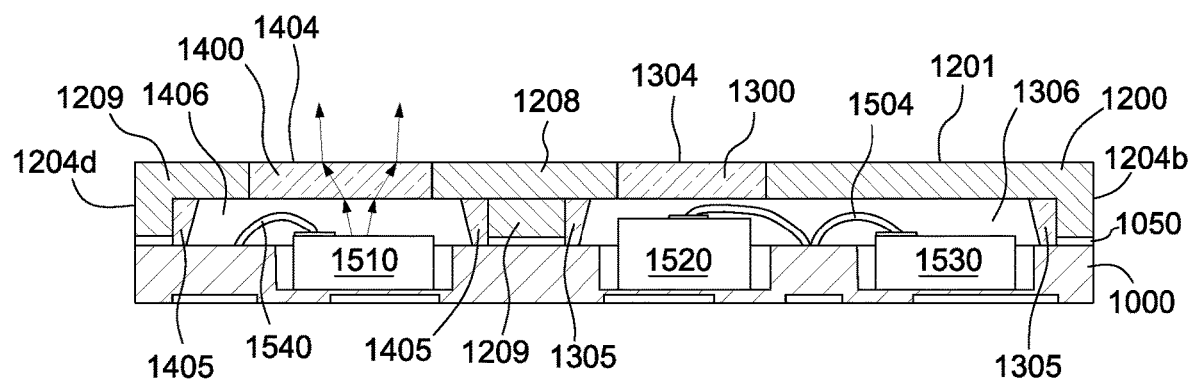
FIG. 10E illustrates a cross-sectional view of a semiconductor device package according to some embodiments of the present disclosure.

FIG. 10D illustrates an intermediate product of a semiconductor device package according to some embodiments of the present disclosure. The adhesive 1050 is applied onto the carrier 1000. Semiconductor devices 1510 and 1530 are disposed on the carrier 1000. In some embodiments, the semiconductor devices 1510 and 1530 may be disposed on the top surface of the carrier 1000. In some embodiments, the semiconductor devices 1510 and 1530 may be an optical device or a sensor. A bonding wire 1540 electrically connects a semiconductor device (e.g. the semiconductor device 1510) to the carrier 1000.

FIG. 10E illustrates a cross-sectional view of a semiconductor device package 50 along the line 10E-10E shown in FIG. 10A according to some embodiments of the present disclosure. The arrangement of the transparent encapsulant 1300 or 1400 is an air-type arrangement. Under the air-type arrangement, the light emitted from the semiconductor device (e.g. the semiconductor device 1510) passes through the transparent encapsulant 1400 and at least two refractions occur at interfaces between different materials or media. The lower portion 1305 of the transparent encapsulant 1300 internally covers the wall 1209 and the second bottom surface 1203 of the metal member 1200. The lower portion 1305 of the transparent encapsulant 1300 at least partially covers the bottom surface of the roof portion 1208. The lower portion 1405 of the transparent encapsulant 1400 at least partially covers the bottom surface of the roof portion 1208. The spaces 1306 and 1406 accommodate the bonding wire 1540 and the semiconductor devices 1510, 1520, and 1530.

Figure 10F:
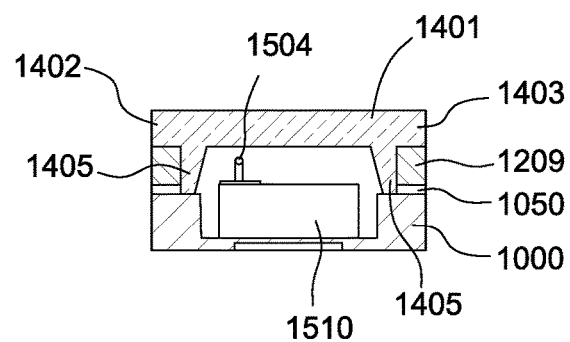
FIG. 10F illustrates a cross-sectional view of a semiconductor device package according to some embodiments of the present disclosure.

FIG. 10F illustrates a cross-sectional view of a semiconductor device package 50 along the line 10F-10F shown in FIG. 10A according to some embodiments of the present disclosure. The first extension 1402 and the second extension 1403 are supported by the wall 1209 at the third recess 1213 and the fourth recess 1214. The lower portion 1405 of the transparent encapsulant 1400 is in direct contact with the wall 1209 of the metal member 1200.

Figure 11A:
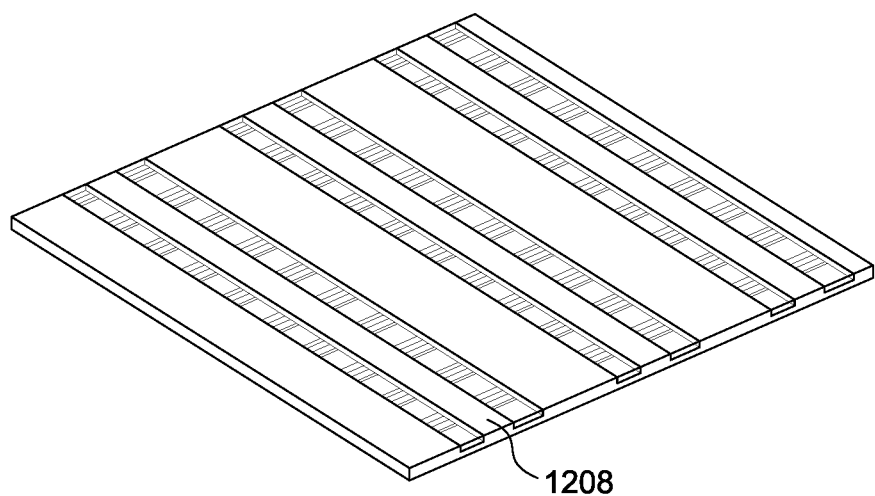
FIG. 11A illustrates a top view of an array of metal members according to some embodiments of the present disclosure.

In some embodiments, the array of metal members may include multiple runners, each of which has multiple spaces for forming multiple transparent encapsulants. FIG. 11A illustrates a top view of an array of metal members according to some embodiments of the present disclosure. The array of metal members includes a plurality of runners for injecting gel. In at least one metal member of the array, two runners are separated by a roof portion 1208.

Figure 11B:
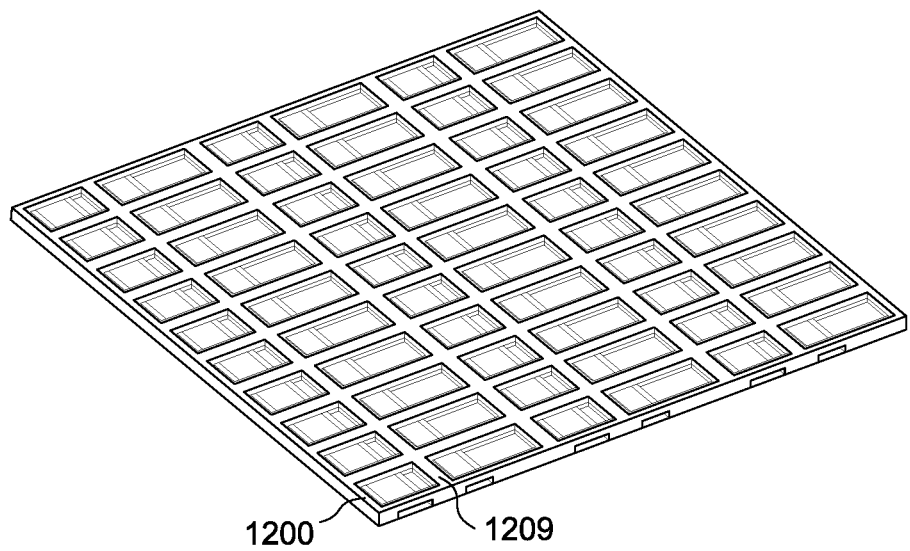
FIG. 11B illustrates a bottom view of an array of metal members according to some embodiments of the present disclosure.

FIG. 11B illustrates a bottom view of an array of metal members according to some embodiments of the present disclosure. Two spaces in the metal member 1200 are separated by the wall 1209.

Figure 12A:
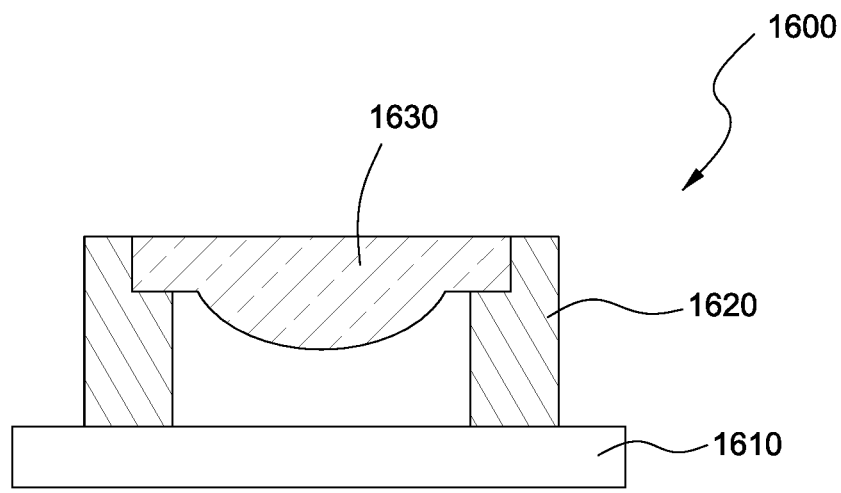
FIG. 12A illustrates a cross-sectional view of a lens structure according to some embodiments of the present disclosure.

In some embodiments, the transparent encapsulant may serve as an optical lens (e.g., a dome lens). As shown in FIG. 12A, FIG. 12B, FIG. 12C, FIG. 12D, and FIG. 12E, the lens structures can vary depending on the optical specification of the semiconductor device. FIG. 12A illustrates a cross-sectional view of a lens structure 1630 in accordance with some embodiments of the present disclosure. The lens structure 1630 supported by a frame 1620 on a carrier 1610. In some embodiments, the frame 1620 may be made of metal or other suitable materials for supporting the lens 1630. The lens 1630 may be formed of, or include, resin or other suitable, transparent material. The lens 1630 may be, or include, a clear molding formed lens. In some embodiments, the lens 1630 can be, e.g., a one-side convex lens. The surface of the lens 1630 includes a flat side and a convex side. The convex side faces towards the carrier 1610.

Figure 12B:
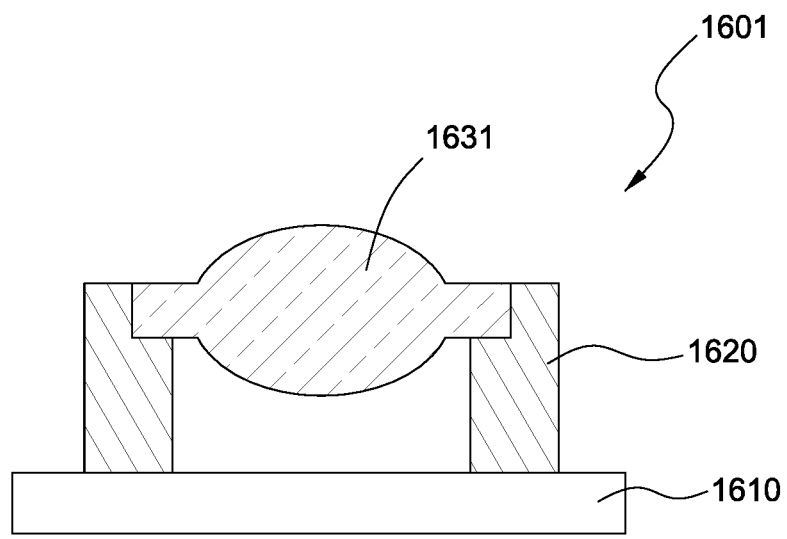
FIG. 12B illustrates a cross-sectional view of a lens structure according to some embodiments of the present disclosure.

FIG. 12B illustrates a cross-sectional view of a lens structure 1631 in accordance with some embodiments of the present disclosure. The lens structure 1631 supported by a frame 1620 on a carrier 1610. Except that the lens 1631 is a two-side convex lens, the structure of FIG. 12B is similar to that of FIG. 12A. The surface of the lens 1631 includes a top convex side and a bottom convex side.

Figure 12C:
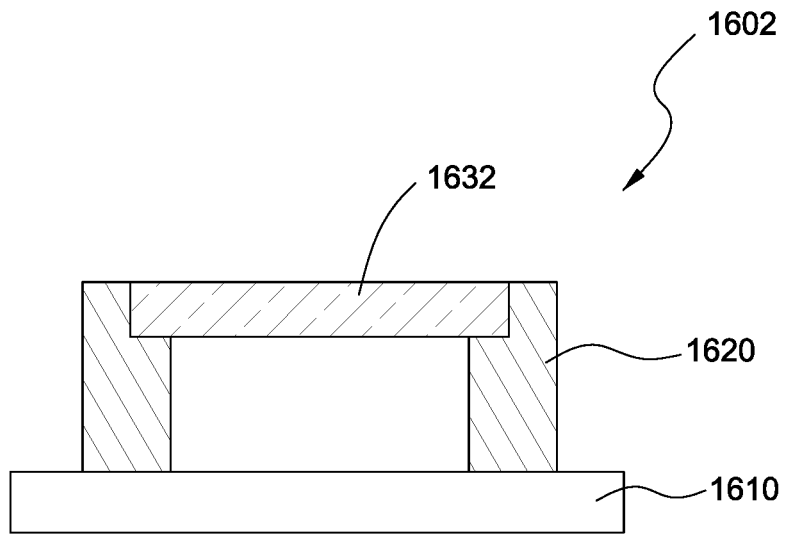
FIG. 12C illustrates a cross-sectional view of a lens structure according to some embodiments of the present disclosure.

FIG. 12C illustrates a cross-sectional view of a lens structure 1632 in accordance with some embodiments of the present disclosure. The lens structure 1632 supported by a frame 1620 on a carrier 1610. Except that the lens 1632 is a planar lens or a glass, the structure of FIG. 12C is similar to that of FIG. 12A. The surface of the lens 1632 includes a top flat side and a bottom flat side.

Figure 12D:
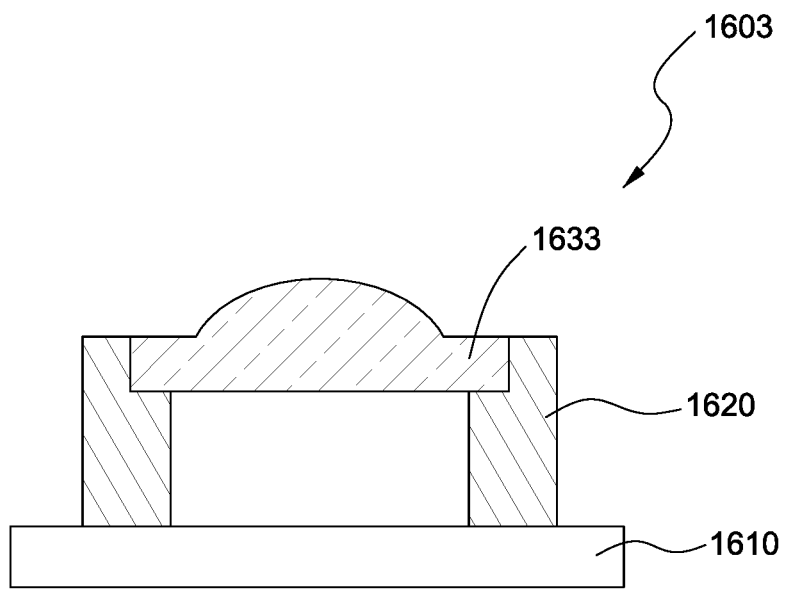
FIG. 12D illustrates a cross-sectional view of a lens structure according to some embodiments of the present disclosure.

FIG. 12D illustrates a cross-sectional view of a lens structure 1633 in accordance with some embodiments of the present disclosure. The lens structure 1633 supported by a frame 1620 on a carrier 1610. The lens 1633 is a one-side convex lens. Except that the planar side of the lens 1633 faces to the carrier 1610, the structure of FIG. 12D is similar to that of FIG. 12A. As shown in FIG. 12D, the surface of the lens 1633 includes a flat side and a convex side. The flat side faces towards the carrier 1610.

Figure 12E:
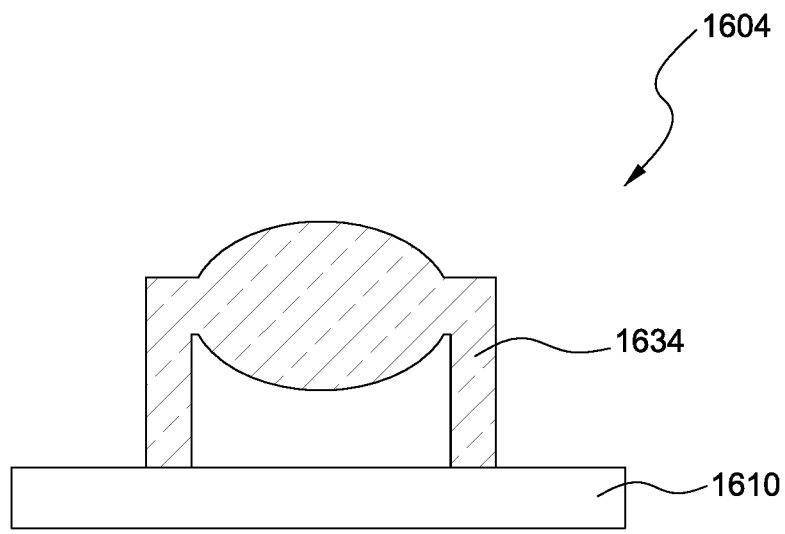
FIG. 12E illustrates a cross-sectional view of a lens structure according to some embodiments of the present disclosure.

FIG. 12E illustrates a cross-sectional view of a lens structure 1634 in accordance with some embodiments of the present disclosure. The lens structure 1634 includes a two-side convex lens. The lens structure 1634 further includes a frame that supports the two-side convex lens on a carrier 1610. In other words, the convex lens and the frame are integrally formed as a single lens structure 1634. Since the frame is formed of the same transparent material (e.g., resin) as the convex lens, the integrally formed frame is also referred to as transparency wall. In some embodiments, the lens structure 1634 may be formed of, or include, resin or other suitable materials.

Under the spirit of the present disclosure, the transparent encapsulant 200 of FIG. 1A, FIG. 2A, and FIG. 3A and the glass layer 302 of FIG. 4 may be replaced by the lens structure as illustrated and described with reference to FIG. 12A, FIG. 12B, FIG. 12C, FIG. 12D, or FIG. 12E.

Figure 13A:
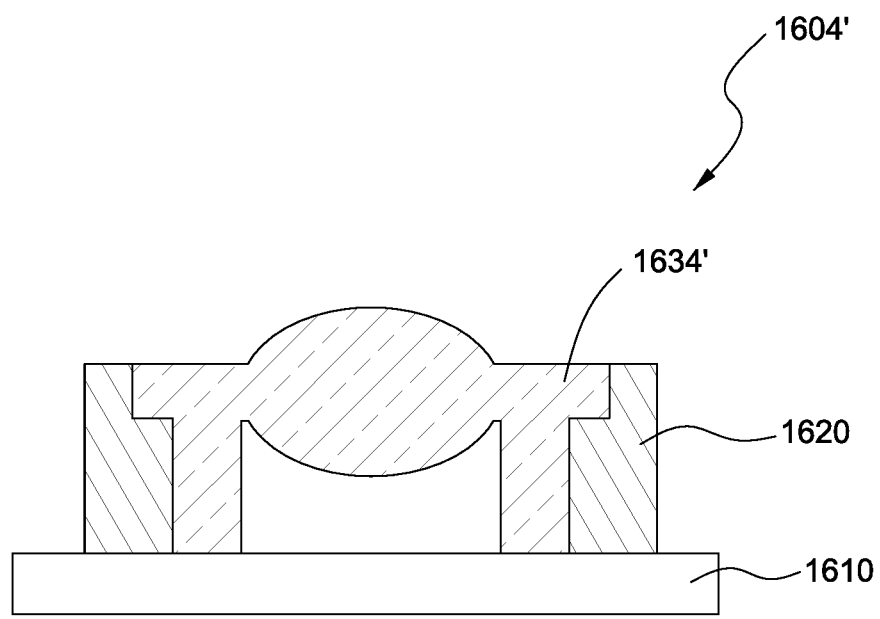
FIG. 13A illustrates a cross-sectional view of a lens structure according to some embodiments of the present disclosure.

In some embodiments, a semiconductor device package can further include a frame to support the lens structure as illustrated in FIG. 12E. FIG. 13A illustrates a cross-sectional view of a lens structure 1634' in accordance with some embodiments of the present disclosure. The lens structure 1634' supported by a carrier 1610 and a frame 1620 on the carrier 1610. In some embodiments, the type of the lens 1634 may be of various shapes, such as convex, concave, or planar.

Figure 13B:
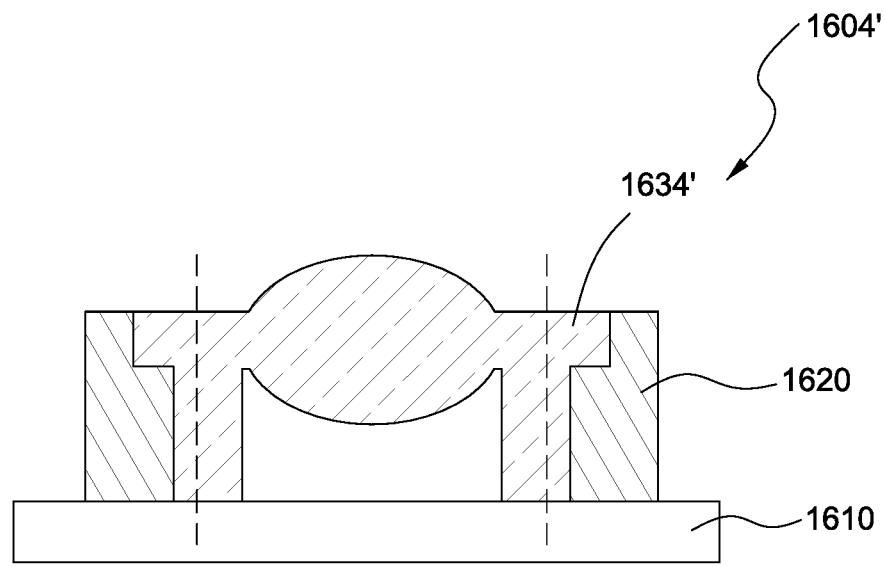
FIG. 13B illustrates a cross-sectional view of a lens structure according to some embodiments of the present disclosure.

During a singulation process, the semiconductor device packages including the lens structures can be singulated (separated) by cutting through, e.g., portions of the lens structures. FIG. 13B illustrates a cross-sectional view of a lens structure 1634' in accordance with some embodiments of the present disclosure. The dotted lines indicate the positions which are cut through by saws during a singulation operation.

Figure 13C:
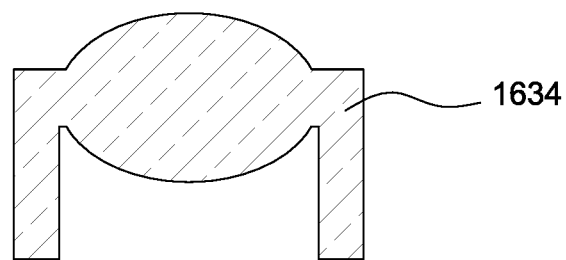
FIG. 13C illustrates a cross-sectional view of a lens structure according to some embodiments of the present disclosure.

FIG. 13C illustrates a cross-sectional view of a lens structure 1634' in accordance with some embodiments of the present disclosure. After performing the singulation operation, the carrier 1610 is further removed. After removing the carrier 1610, the lens structure 1634 is formed.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:
1. A lid for covering an optical device, comprising:
a metal member including a top surface, a bottom surface, a first surface opposite to the top surface and between the top surface and the bottom surface, and a second surface opposite to the bottom surface and between the top surface and the bottom surface; and a transparent encapsulant supported by the metal member and being in direct contact with the first surface, wherein the transparent encapsulant covers at least a portion of the second surface.

2. The lid of claim 1, wherein the transparent encapsulant comprises a top surface that is substantially coplanar with the top surface of the metal member.

3. The lid of claim 1, wherein the transparent encapsulant extends over the top surface of the metal member.

4. The lid of claim 1, wherein the transparent encapsulant comprises a lens structure.

5. The lid of claim 1, wherein the transparent encapsulant and the first surface of the metal member define a space for accommodating the optical device or for accommodating a wire electrically connected to the optical device.

* * * * *